(12) United States Patent
Shimizu

(10) Patent No.: US 6,810,498 B2
(45) Date of Patent: Oct. 26, 2004

(54) RAM FUNCTIONAL TEST FACILITATION CIRCUIT WITH REDUCED SCALE

(75) Inventor: Ryuji Shimizu, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 399 days.

(21) Appl. No.: 10/106,052

(22) Filed: Mar. 27, 2002

(65) Prior Publication Data

US 2002/0162064 A1 Oct. 31, 2002

(30) Foreign Application Priority Data

Apr. 25, 2001  (JP) ........................................ 2001-127048

(51) Int. Cl.[7] .............................................. G01R 3/28
(52) U.S. Cl. ...................................................... 714/726
(58) Field of Search ................................ 714/718, 724, 714/726, 727, 729; 365/201

(56) References Cited

U.S. PATENT DOCUMENTS 5,960,008 A * 9/1999 Osawa et al. ................ 714/726

* cited by examiner

Primary Examiner—Guy J. Lamarre
Assistant Examiner—James Kerveros
(74) Attorney, Agent, or Firm—Arent Fox PLLC

(57) ABSTRACT

The outputs of selectors 230 to 23N are respectively connected to the data inputs DI0 to DIN of a RAM 10A. One inputs of selectors 540 to 54N are respectively connected to the data outputs DO0 to DON of the RAM 10A, the other inputs are connected to corresponding outputs of the selectors 230 to 23N. The outputs of the selectors 540 to 54N are connected to data inputs D of respective scan flip-flops 520 to 52N. Not in a RAM test mode, data input lines 210 to 21N are selected by the selectors 230 to 23N to provide to the data inputs DI0 to DIN of the RAM 10A and to the scan flip-flops 520 to 52N through the selectors 540 to 54N, respectively.

18 Claims, 21 Drawing Sheets

US 6,810,498 B2

RAM FUNCTIONAL TEST FACILITATION CIRCUIT WITH REDUCED SCALE

BACKGROUND OF THE INVENTION

1. Field of the Invention

The present invention relates to a scan path type circuit for facilitating a functional test on a RAM (random access memory) incorporated into a chip.

2. Description of the Related Art

In a functional test on RAM, after a test pattern such as a check board pattern or a marching pattern is written into the RAM, storage contents are read out to compare with corresponding expected values, and thereby fault detection is performed. For this test, a test facilitation circuit is incorporated in an integrated circuit including a RAM.

FIG. 19 shows a prior art test facilitation circuit of a scan path type provided for a RAM 10.

This is a wrapper circuit surrounding the RAM 10 and includes holding and selecting circuits 20, 30, 40 and 50 provided for the data inputs RAM.DI, write enable input RAM.*WE, address inputs RAM.AD and data outputs RAM.DO, respectively, of the RAM 10, wherein "RAM." denotes an input or output of the RAM 10. A circuit block 60 constituted of the RAM 10 and the test facilitation circuit is incorporated into an integrated circuit together with other logic circuits, and the inputs and outputs of the circuit block 60 is connected to a logic circuit or an I/O circuit in the neighborhood thereof.

For example, in the holding and selecting circuit 30, either an interconnecting line 31 or the output Q of a scan flip-flop 32 is selected by a selector 33 in accordance with the signal of a local test mode (RAM test mode) input BLK.LTM, and the selected signal on the interconnecting line 31 or the output of the scan flip-flop 32 is provided to both the write enable input RAM.*WE and the data input D of the scan flip-flop 32, where "BLK." denotes an input or output of the circuit block 60.

The holding and selecting circuit 20 includes, as shown in FIG. 20, holding and selecting circuits 200 to 20N for respective data inputs RAM.DI0 to D1N. Each of the holding and selecting circuits 200 to 20N has the same configuration as that of the holding and selecting circuit 30 of FIG. 19. In FIG. 19, for simplification, data inputs DI0 to DIN having an (N+1) bit width of FIG. 20 are represented by data inputs DI, interconnecting lines 210 to 21N of FIG. 20 are represented by an interconnecting line 21, scan flip-flops 220 to 22N of FIG. 20 are represented by scan flip-flops 22 and selectors 230 to 23N of FIG. 20 are represented by selectors 23. This simplification applies to the holding and selecting circuits 40 and 50 in a similar manner.

All the scan flip-flops in the circuit block 60 have the same configuration as each other and FIG. 21 shows an example of the scan flip-flop 220.

The configuration of the scan flip-flop 220 is such that a selector 2203 for selecting either the scan in terminal SI or the data input D of the scan flip-flop 220 when a scan enable input SE is high or low, respectively, to provide it to the input of a master-slave D flip-flop including a master latch circuit 2201 and a slave latch circuit 2202. The selector 2203 has the same configuration as each of the selectors in the circuit block 60. Each selector is constituted of 4 transistors, while the scan flip-flop 220 is constituted of 32 transistors and the on-chip occupancy area thereof is 8 times that of each selector. In FIG. 21, each of TG0 to TG5 is a transfer gate constituted of a PMOS transistor and an NMOS transistor in parallel connection, and each of INV0 to INV9 is a CMOS inverter consisted of a PMOS transistor and an NMOS transistor in serial connection. In the scan flip-flop 220, the logical value of the output Q is equal to that of the scan out SO.

The scan flip-flops 22, 32, 42, and 52 of the respective holding and selecting circuits 20, 30, 40 and 50 are cascaded in regard to respective scan in SI and scan out SO to constitute a scan register. By serially providing test data for the data inputs RAM.DI, the write enable input RAM.*WE and the address inputs RAM.AD to the scan register from the scan in BLK.GSI, a functional test can be carried out on the RAM 10 independently of a state of a logic circuit in the neighborhood of the circuit block 60. That is, it is possible to perform fault detection by writing an arbitrary test pattern into the RAM 10 by repeating the operations of both serially transferring the test data to the scan register and writing the test data into the RAM 10; reading out the storage contents through the data outputs RAM.DO to capture them into the scan flip-flops 52 of the holding and selecting circuit 50; and serially reading out the captured data through the scan out BLK.GSO to compare them with expected values.

However, since the test data has to be serially transferred to the scan register, a test time increases with increase in bit width of the data input RAM.DI. Further, since especially the number of scan flip-flops increases with the increase in bit width, the on-chip occupancy area of the test facilitating circuit increases. A circuit scale becomes larger due to multifunctionarization of an integrated circuit and the test facilitating circuit is not used in a normal operation, therefore the on-chip occupancy area of the test facilitating circuit is preferably to be the smallest possible.

On the other hand, there are available as typical test patterns a check board pattern and a marching pattern. In a case where these test patterns are used, such test data as all bits being "0s", all bits being "1s", or alternate "0" and "1" are repeatedly held in the scan flip-flops 22; therefore, it is conceivable to simplify the holding and selecting circuit 20.

However, since the scan flip-flops 22 are also part of a scan path type test facilitation circuit for a whole integrated circuit including the circuit block 60 and a logic circuit outside the circuit block 60, the scan flip-flops 22 itself have to capture signals to the data inputs RAM.DI from the logic circuit outside the circuit block 60, having disabled simplification of the configuration of the holding and selecting circuit 20 in the prior art.

Note that although a scan path is formed outside RAM 10 in the circuit of FIG. 19, in a case where flip-flops in RAM 10 are exchanged for scan flip-flops to constitute a scan path, the scan path cannot be simplified to reduce test time. Further, in a case where design data for the RAM 10 is provided from another maker, details in the RAM 10 are not clear, and therefore it is impossible that flip-flops in the RAM 10 are exchanged for scan flip-flops to constitute a scan path.

SUMMARY OF THE INVENTION

Accordingly, it is an object of the present invention to provide a RAM functional test facilitation circuit capable of reducing its scale to decrease an on-chip occupancy area and to shorten a test time.

In one aspect of the present invention, there is provided a circuit for facilitating a functional test on a RAM (10A), wherein the outputs of a plurality of first selectors (230 to 23N) are connected to the respective data inputs (DI0 to DIN) of the RAM, the first inputs of a plurality of second selectors (540 to 54N) are connected to the respective data outputs (DO0 to DON) of the RAM, the second inputs of the second selectors are connected to the respective data inputs (DI0 to DIN) of the RAM, and the outputs of the second selectors are connected to the respective data inputs of the second scan flip-flops (520 to 52N).

When a test mode signal is inactive, the first inputs of the first selectors are selected to provide data to the data inputs of the RAM, and the outputs of the first selectors are selected by the second selectors to provide the data to the data inputs of the second scan flip-flops.

With this, in a functional test on a logic circuit, since outputs of the logic circuit provided to the RAM can be captured into the second scan flip-flops, no necessity arises for capturing the outputs by first scan flip-flops (22 of FIG. 19) to be connected to the second inputs of the first selectors (230 to 23N), and therefore the first scan flip-flop (220) can be exclusively used for the RAM functional test. Hence for a simple pattern such as a marching pattern, an output of one first scan flip-flop has only to be selected by the plurality of first selectors to provide the selected data to the RAM. Since the number of transistors in a scan flip-flop is, for example, ⅛ times that of a selector, according to the above aspect, the circuit scale of the RAM functional test facilitation circuit can be reduced to thereby decrease an on-chip occupancy area thereof.

Further, since the number of first scan flip-flops can be greatly reduced, the bit length of a scan register is shortened to decrease the number of necessary shift clock pulses, thereby reducing a test time.

In other aspect of the present invention, the contents of the scan register to be provided to the data and address inputs of the RAM are maintained in a read and write test operation on the RAM for the same address, the test time can be further reduced.

Other aspects, objects, and the advantages of the present invention will become apparent from the following detailed description taken in connection with the accompanying drawings.

DESCRIPTION OF THE PREFERRED EMBODIMENTS

Figure 1:
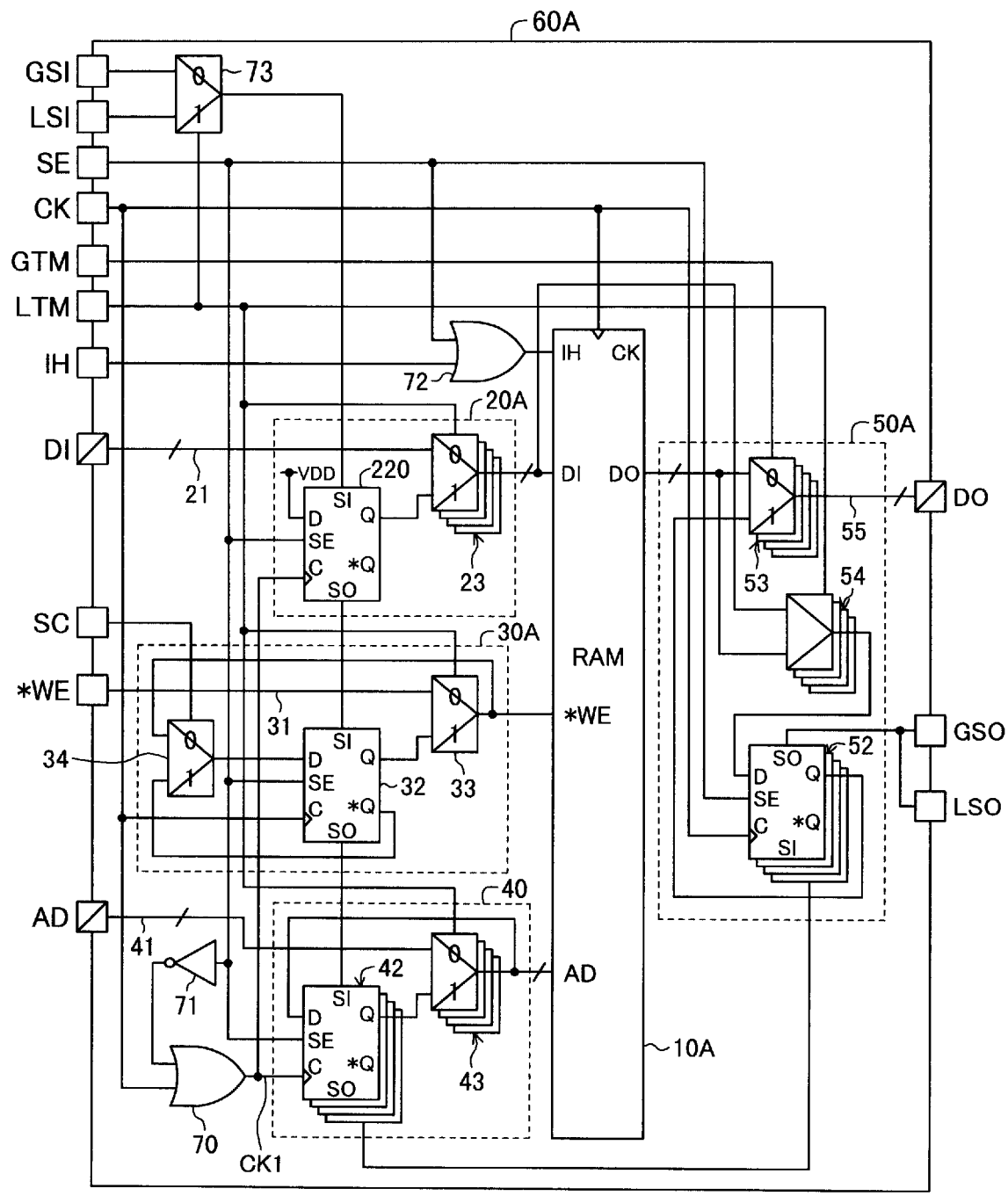
FIG. 1 is a diagram showing RAM with a test facilitation wrapper circuit of a first embodiment according to the present invention.

Referring now to the drawings, wherein like reference characters designate like or corresponding parts throughout several views, preferred embodiments of the present invention are described below.

First Embodiment

Figure 2:
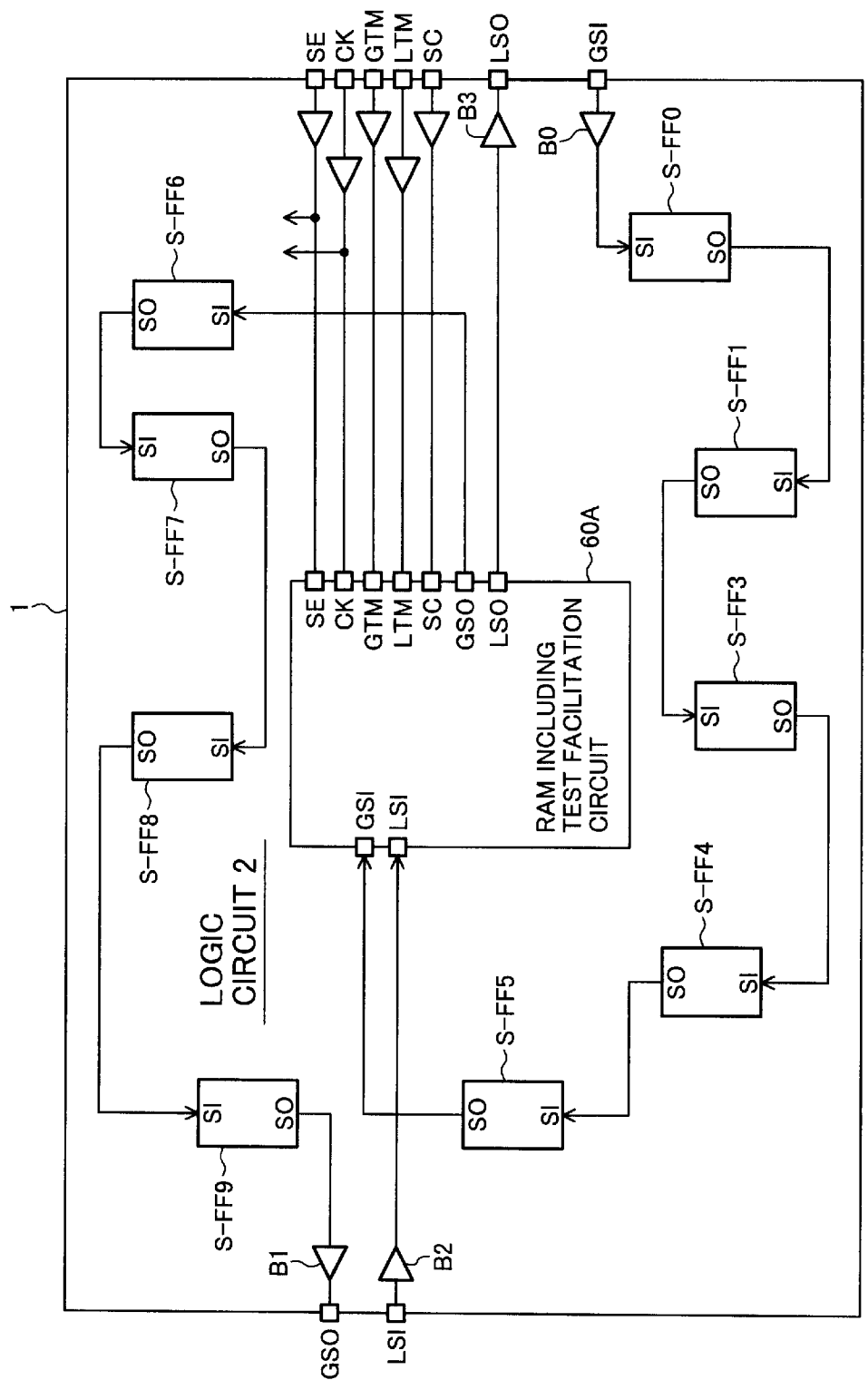
FIG. 2 is a schematic block diagram of an integrated circuit including the circuit block of FIG. 1 and a logic circuit outside this circuit block.

FIG. 1 shows a RAM 60A including a test facilitation wrapper circuit of a first embodiment according to the present invention. FIG. 2 is a schematic block diagram of an integrated circuit 1 including a logic circuit 2 outside the circuit block 60A of FIG. 1.

First of all, with reference to FIGS. 1 to 2, description will be given of the outline of a test through the use of a scan path.

The logic circuit 2 is constituted of a combinational circuit and a sequential circuit, and the flip-flops of the sequential circuit were replaced with scan flip-flops S-FF0 to S-FF9 which were cascaded to constitute a scan register. The scan flip-flops S-FF0 to S-Ff9 are also cascaded to scan flip-flops in the circuit block 60A, constituting a global scan register on an entire chip. In order to distinguish the scan register in the circuit block 60A from the global scan register, the scan register in the circuit block 60A is referred to a local scan register.

In a case where a functional test is performed on a combinational circuit in the logic circuit 2, a local test mode (a RAM test mode) IC.LTM is kept low and thereby, in FIG. 1, a selector 73 in the circuit block 60A selects the global scan in BLK.GSI, where IC. denotes an input or output of the integrated circuit 1 and BLK. denotes an input or output of the circuit block 60A.

In FIG. 2, when the scan enable IC.SE is high, a shift operation of the scan register is enabled and test data is serially provided from the global scan in terminal IC.GSI in synchronism with a clock signal provided to the clock input terminal IC.CK. The data passes through a buffer circuit B0, is shifted in the scan flip-flops S-FF0 to S-FF5, is provided to the global scan in BLK.GSI, furthermore passes through the scan register in the circuit block 60A, propagates to a global scan out BLK.GSO, and is shifted in the scan flip-flops S-FF6 to S-FF9. Thereby test data is provided from the san register to the combinational circuit in the logic circuit 2. Then, the scan enable input SE is driven low and one clock pulse is provided from the clock input terminal IC.CK, outputs of the combinational circuit associated with the scan flip-flops S-FF0 to S-FF9 and the scan slip-flops in the circuit block 60A described later are captured into these scan flip-flops. Next, the scan enable input SE is driven high and a clock pulse is provided from the clock input terminal IC.CK, the data captured by the scan flip-flops are taken out from the global scan out terminal IC.GSO through a buffer circuit B1 and compared with expected values.

In a case where a test is carried out on the RAM 10A in the circuit block 60A, in order to shorten the bit length of the scan register to thereby reduce a test time, the local test mode IC.LTM is kept high. Thus, the selector 73 in the circuit block 60A of FIG. 1 selects a local scan in BLK.LSI. In FIG. 2, when the scan enable input SE is high, a shift operation of the local scan register is enabled and test data is serially provided from the local scan in terminal IC.LSI in synchronism with the clock provided to the clock input terminal IC.CK. The data passes through a buffer circuit B2 and is provided to the local scan register in the circuit block 60A to be shifted. Thereby an address and data are provided to the RAM 10A. Next, the scan enable input SE is driven low and a predetermined number of clock pulses are provided from the clock input terminal IC.CK, and a read or write operation on the RAM 10A is performed, wherein in a read operation, readout data is captured into the scan register. In this read operation, the scan enable input SE is driven high and a clock pulse is provided from the clock input terminal IC.CK, then the data captured is serially taken out through the local scan out BLK.LSO and a buffer circuit B3 from the local scan out terminal IC.LSO to compare the data with expected values.

Next, detailed description will be given of the circuit block 60A.

Figure 3:
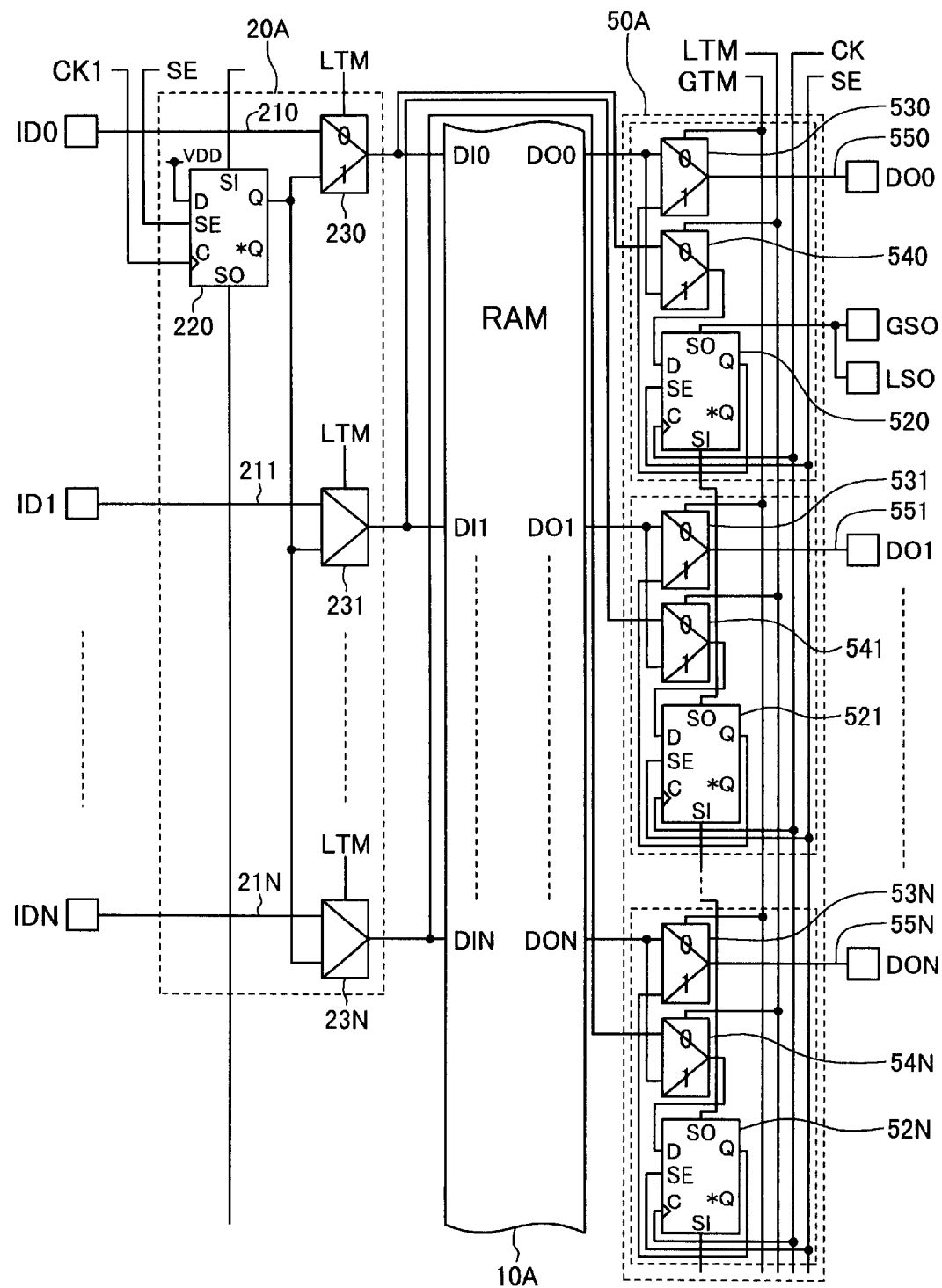
FIG. 3 is a circuit diagram showing part of FIG. 1 in more detail.

FIG. 3 is a circuit diagram showing part of FIG. 1 in more detail.

Figure 19:
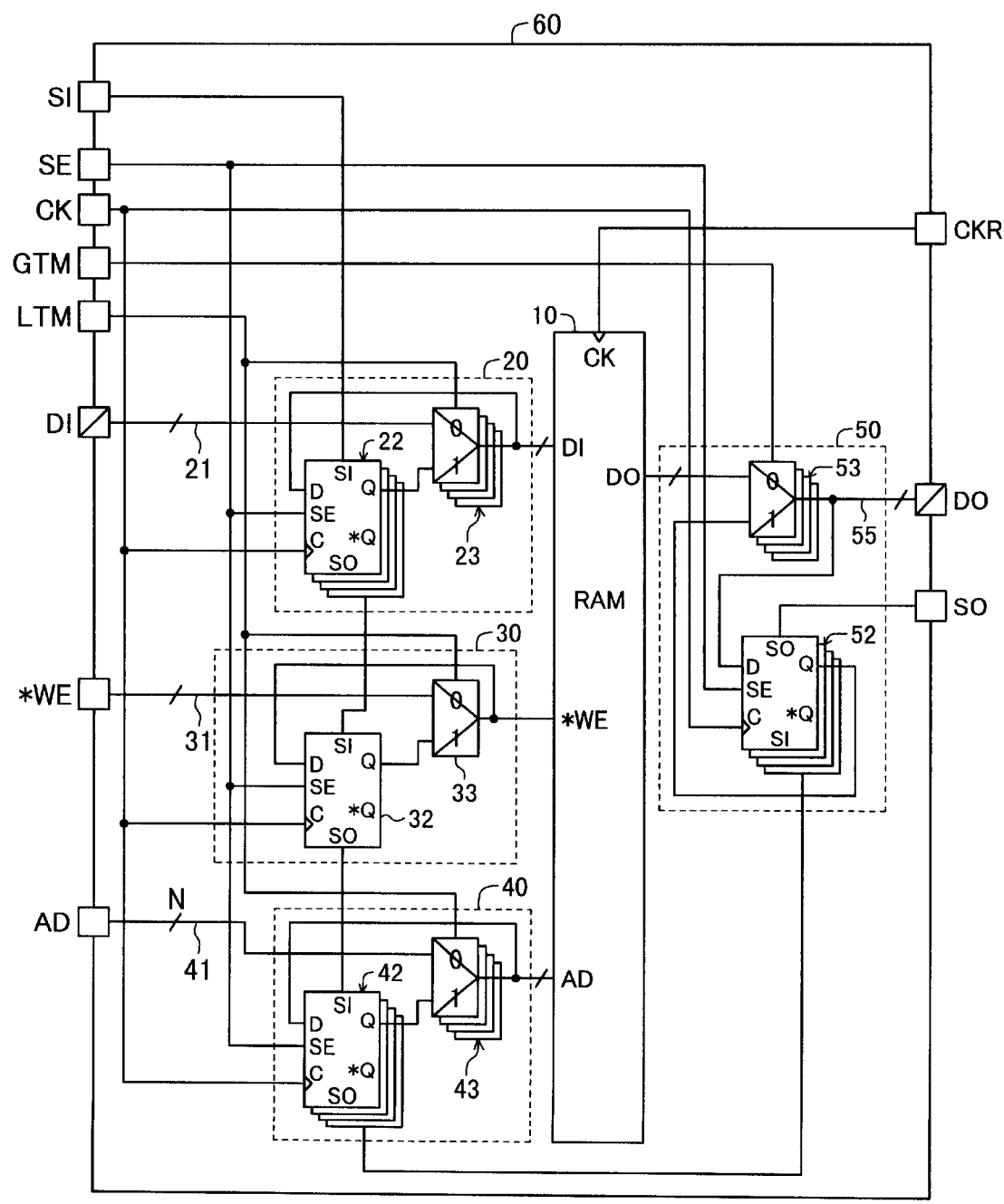
FIG. 19 is a diagram showing a prior art test facilitation wrapper circuit of a scan path type provided for a RAM.

In FIG. 1, as in the case of FIG. 19, data inputs DI0 to DIN with an (N+1) bit width of FIG. 3 are representatively denoted by DI and selectors 230 to 23N of FIG. 3 are representatively denoted by selectors 23. This applies to the holding and selecting circuits 40 and 50A and data outputs DO in a similar manner. Further, '0' written in each selector denotes the side selected when a selected control value is '0', which goes in a case of '1' in a similar manner.

The RAM functional test facilitation circuit of the first embodiment is configured such that a test is carried out on the RAM 10A through the use of marching patterns in the local test mode. Since the marching pattern has bits being all '0' or '1', the bits being all '0' or '1' are set to data inputs RAM.DI in the test, where RAM. denotes an input or output of the RAM 10A.

Figure 20:
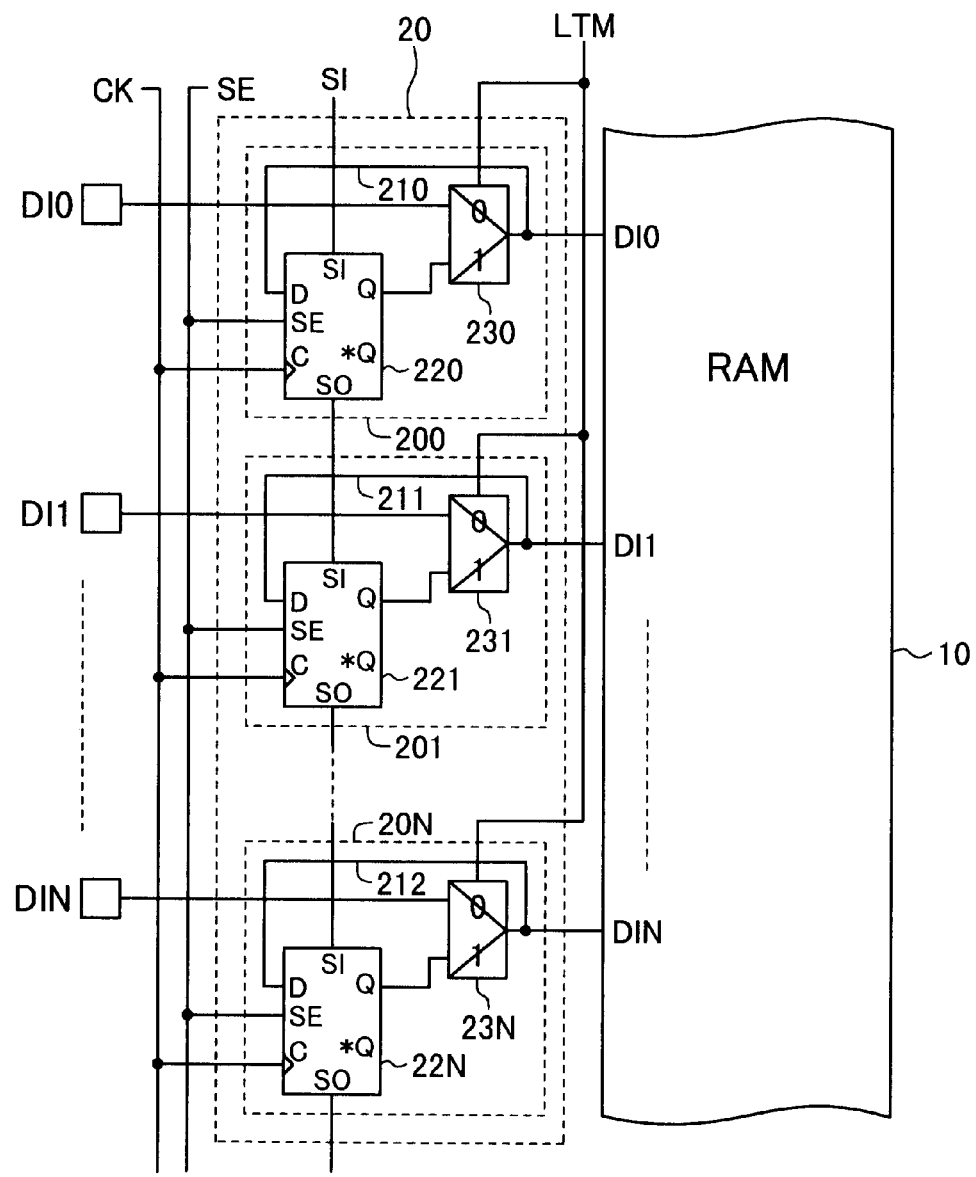
FIG. 20 is a circuit diagram showing part of FIG. 19 in more detail.

A holding and selecting circuit 20A is different from the holding and selecting circuit 20 of FIG. 20 in that the scan flip-flop 220 is used commonly to the selectors 23 provided for the respective data inputs RAM.DI in consideration of the above description. That is, the output Q of the scan flip-flop 220 is connected to one inputs of the selectors 23.

Figure 21:
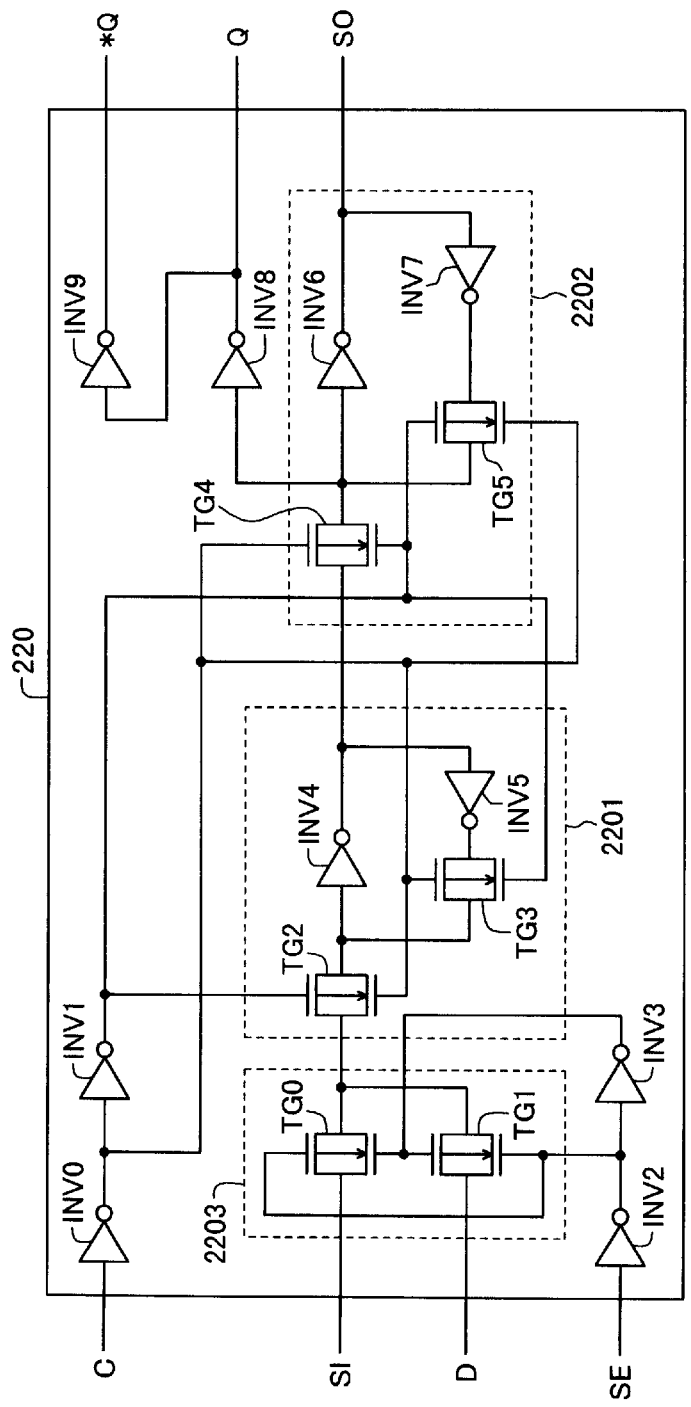
FIG. 21 is a circuit diagram showing an example of a prior art scan flip-flop.

The scan flip-flop 220 is configured as shown in FIG. 21 for example. The data input D of the san flip-flop 220 is not used because of no relation with the logic circuit 2 and is fixed at a power supply potential VDD (may be fixed at 0 V). The scan in SI and scan enable input SE of the scan flip-flop 220 are connected to the output of the selector 73 and the scan enable input BLK.SE, respectively. The global scan in BLK.CSI and the local scan in BLK.LSI are connected to one and the other inputs, respectively, of the selector 73.

The signal of the local test mode input BLK.LTM is provided to the control inputs of the selectors 23 and when the signal is high or low, the output Q of the scan flip-flop 220 or interconnecting lines 21 connected to data inputs BLK.DI, respectively, are selected and the selected signals are provided to the data inputs RAM.DI. In the scan flip-flop 220 on a rise of the clock signal, data of the scan in SI is captured when the scan enable input BLK.SE is high, while '1' of the data input D is captured when the scan enable input BLK.SE is low.

Since the scan flip-flop 220 is used commonly to the selectors 230 to 23N, a signal to the data inputs RAM.DI from the logic circuit 2 cannot be captured by only the holding and selecting circuit 20A in a global test mode (logic circuit test mode).

Therefore, in order to enable this, selectors 540 to 54N are provided in the holding and selecting circuit 50A, the outputs of the selectors 230 to 23N are connected to respective one inputs of the selectors 540 to 54N, the data outputs RAM.D00 to RAM.DON are connected to the other inputs of the respective selectors 540 to 54N and the outputs of the selectors 540 to 54N are connected to the data inputs D of respective scan flip-flops 520 to 52N. The other parts of the configuration of the holding and selecting circuit 50A are of the same as those of the configuration of the holding and selecting circuit 50 of FIG. 19. That is, one inputs of selectors 530 to 53N are connected to the respective data outputs RAM.DO0 to RAM.DON, while the other inputs are connected to the respective non-inverting outputs Q of the flip-flops 520 to 52N and the outputs of the scan flip-flops 530 to 53N are connected to the data outputs BKL.DO0 to BLK.DON through interconnecting lines 550 to 55N, respectively. The scan flip-flops 520 to 52N are cascaded in regard to their scan in SI and scan out SO to constitute a scan register, and the scan out SO of the san flip-flop 520 is connected to the global scan out BLK.GSO and the local scan out BLK.LSO.

The signal of the local test mode BLK.LTM is provided to the control inputs of the selectors 540 to 54N. In a capture operation in the global test mode, the local test mode input BLK.LTM is low and thereby the outputs of the selectors 230 to 23N are selected by the respective selectors 540 to 54N. The scan flip-flops 520 to 52N at this time function in a similar manner to the scan flip-flops 220 to 22N of FIG. 20. In the global test mode, the global test mode input BLK.GTM is kept high, and thereby the outputs Q of the scan flip-flops 520 to 52N are selected by the selectors 530 to 53N. The scan flip-flops 52 at this time function in a similar manner to those of FIG. 19.

In the local test mode, the local test mode input BLK.LTM is kept high and thereby the output Q of the scan flip-flop 220 is selected by the selectors 230 to 23N and provided to the data inputs RAM.DI0 to RAM.DIN. Hence, it is possible to provide test data to the RAM 10A. Furthermore, since the data outputs RAM.DO0 to RAM.DON are selected by the selectors 540 to 54N, read data can be captured into the scan flip-flops 520 to 52N.

According to the first embodiment, the output of one scan flip-flop 220 is commonly used by the selectors 230 to 23N and the selectors 540 to 54n are provided for the holding and selecting circuit 50A as described above; thereby enabling the scan flip-flops 520 to 52N to be used not only in the local test but also in the global test. Therefore, the scale of the test facilitation circuit is reduced as a whole, which enables the on-chip occupancy area thereof to decrease.

Figure 4:
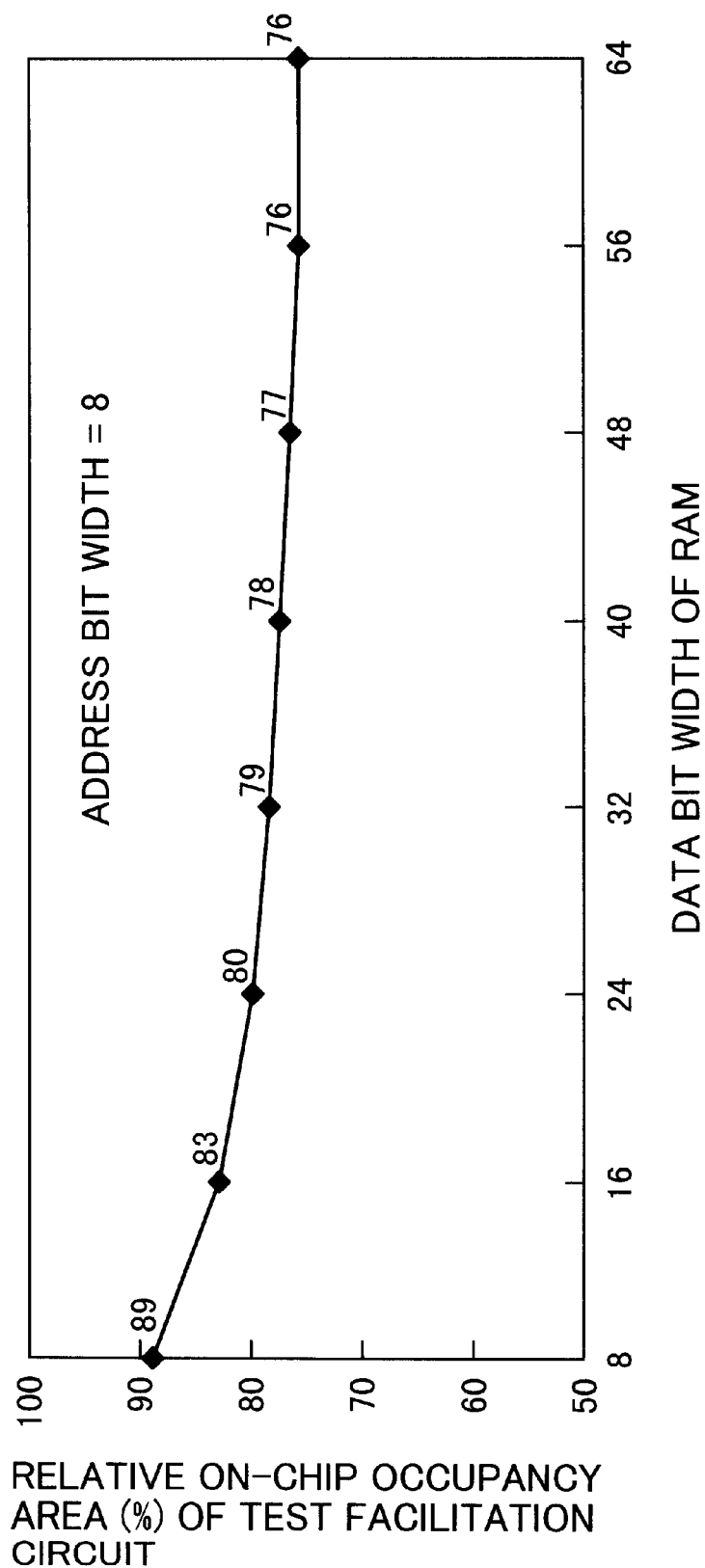
FIG. 4 is a graph whose abscissa represents data bit width and ordinate represents the percentage of the on-chip occupancy area of the test facilitation circuit of FIG. 1 to that of a circuit of FIG. 19.

FIG. 4 shows the percentage of the on-chip occupancy area of the test facilitation circuit of FIG. 1 relative to that of the circuit of FIG. 19 when the address bit width (M−1) is 8. The abscissa represents a data bit width (N−1). As is obvious from the figure, with increase in data bit width, the reduction efficiency of the on-chip occupancy area is higher and for example, when the data bit width is equal to 32, the on-chip occupancy area of the test facilitation circuit can be reduced than that of the prior art by 21%.

Further, since the number of scan flip-flops can be greatly reduced, the bit length of the scan register is shorter and the necessary number of shift clock pulses decreases, thereby reducing the test time.

Meanwhile, description will be given of a marching pattern test.

For example, the data input RAM.DI has 8 bits and the operation of writing '00000000' or '11111111' is denoted by W(0) or W(1), respectively, and the operation of reading data from one arbitrarily address where '00000000' or '11111111' have been written is denoted by R(0) or R(1), respectively. Further, for example, the operation of writing '11111111' after having been read from an address where '00000000' had been written is denoted by R(0)W(1).

The following processing is carried out in the marching pattern test:

(1) W(0)s are sequentially carried out in ascending order of address;

(2) R(0)W(1)s are sequentially carried out in ascending order of address; and (3) R(1)W(0)s are sequentially carried out in descending order of address.

Next, the following processing are performed that 0 and 1 in the above operations (1) and (3) are inverted:

(4) W(1)s are sequentially carried out in ascending order of address;

(5) R(1)W(0)s are sequentially carried out in ascending order of address; and (6) R(0)W(1)s are sequentially carried out in descending order of address.

In each of the above (2), (3), (5) and (6), a read and write operation is carried out for the same address. Therefore, if in a read operation, the address and write data are serially transferred to the scan register to hold, and the address and write data are maintained till a write operation, two operations that in a read operation the address is serially transferred to the scan register to hold and that in a write operation the address and the write data are serially transferred to the scan register to hold can be reduced to one operation.

(A) However, in a case where a read operation is performed on the RAM 10A after data is set in the scan register, readout data is required to be captured into the scan flip-flop 52. Therefore, the scan enable input BLK.SE is driven low, and thereby the data inputs D of the scan flip-flops 22 and 42 become effective and the contents of the scan flip-flops 22 and 42 each have a chance to be altered by the output from the logic circuit 2 to the RAM 10A in a read operation.

(B) Further, in a case where a write operation is carried out, it is required that a write enable bit *WE located between an address and data in the scan register is inverted to be '0'.

Because of such reasons, although addresses and data held in the scan flip-flops 22 and 42 are the same in read and write operations, a necessity arises for again transferring test data from the local scan in terminal IC.LSI to the scan register in a write operation, causing increase in test time.

(C) Furthermore, in order to prevent the contents of the RAM 10A from altering with *WE going low in a shift operation on the scan register, a necessity arises for, in the prior art, providing the clock input BLK.CKR for the RAM 10A as shown in FIG. 19, thus increasing the number of test terminals.

For the purpose to solve the problem (A), in the circuit of FIG. 1, the scan enable BLK.SE is provided to one input of an OR gate 70 through an inverter 71, the clock input BLK.CK is provided to the other input of the OR gate 70 and the output of the OR gate 70 is provided to the clock inputs C of the scan flip-flops 220 and 42. During a read operation on the RAM 10A, since the scan enable input SE is low, the output of the OR gate 70 maintains high and thereby clock pulses are not provided to the clock inputs C of the scan flip-flops 220 and 42, thus enabling maintaining the contents of these flip-flops.

Now the RAM 10A is different from the RAM 10 of FIG. 19 in that the RAM 10A has the inhibit input RAM.IH. During the inhibit input RAM.IH is high, since an internal clock of the RAM 10A ceases even if a clock pulse is provided to the clock input RAM.CK, the RAM 10A keeps itself in a suspended state.

Hence, for the purpose to solve the problem (C), the scan enable input BLK.SE and the inhibit input BLK.IH are provided to an OR gate 72 and the output thereof is provided to the inhibit input RAM.IH. During the scan register carries out a shift operation, that is, during the scan enable input BLK.SE is high, the inhibit input RAM.IH maintains high even if the inhibit input BLK.IH is low and the RAM 10A is in the suspended state. Thereby, the test clock input BLK.CKR of FIG. 19 can be omitted.

In order to enable the above (B) operation, a selector 34 is provided in a holding and selecting circuit 30A. The output of a selector 33 and the inverting output *Q of a scan flip-flop 32 are connected to one and the other inputs of the selector 34, and the output of the selector 34 is connected to the data input D of the scan flip-flop 32. The control input of the selector 34 is connected to the select control input BLK.SC. The select control input BLK.SC is usually low and at this time, the output of the selector 33 is selected by the selector 34 and the holding and selecting circuit 30A operates in a similar manner to the holding and selecting circuit 30 of FIG. 19. When operation changes from read to write, the select input BLK.SC goes high, the inverted output *Q of the scan flip-flop 32 is selected by the selector 34, the non-inverted output Q of the san flip-flop 32 is inverted on a rise of the clock input BLK.CK and thereby the write enable input RAM.*WE is inverted to '0' to enter into a write state.

Then, description will be given of all the operations of the circuit block 60A.

FIGS. 5 to 7, 11 and 12 each show effective data paths with thick lines in respective operating modes.

Figure 5:
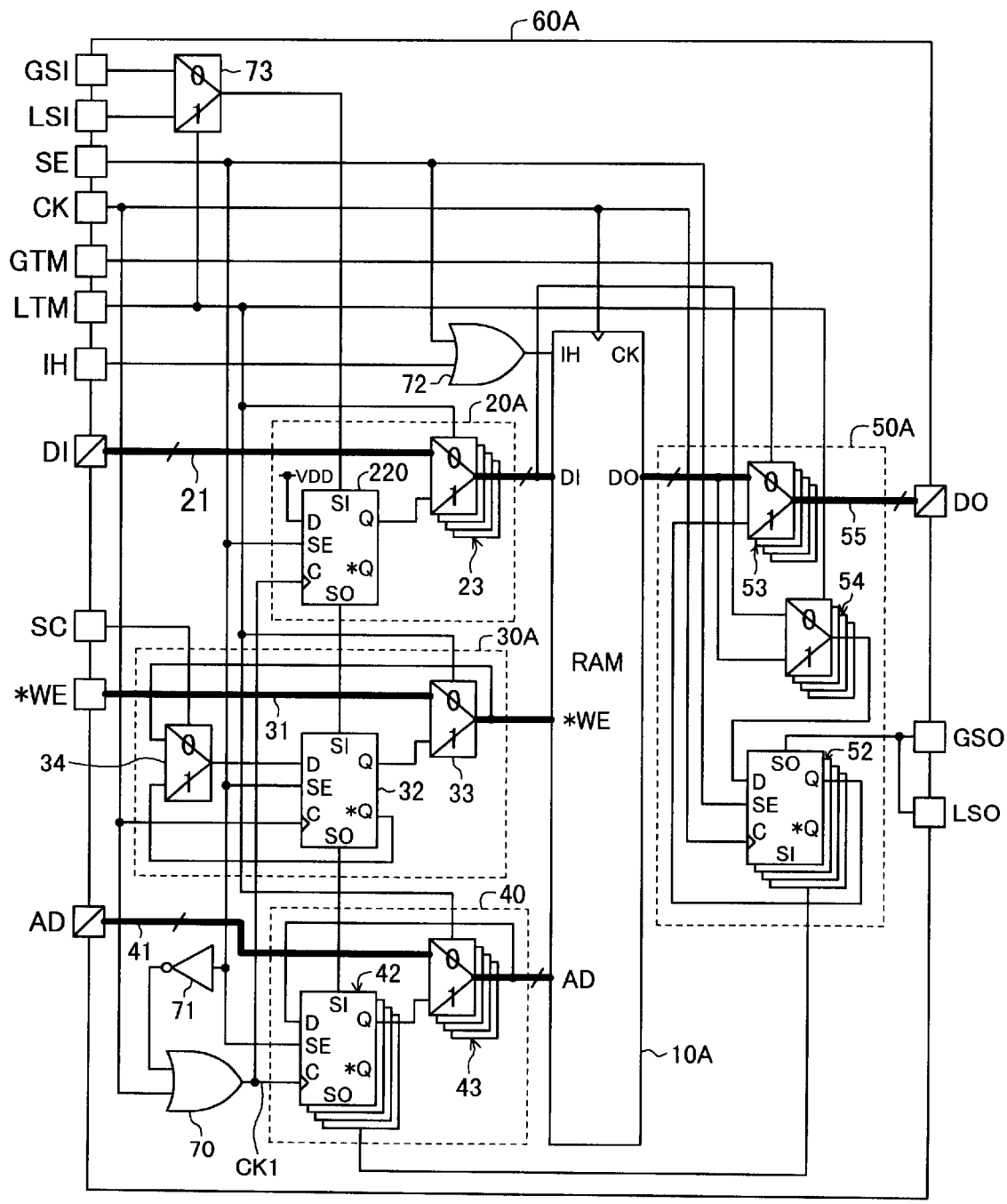
FIG. 5 is an illustrative circuit diagram depicting effective data paths in a normal operation mode of the circuit of FIG. 1 with thick lines.

FIG. 5 is an illustrative circuit diagram in the normal operation mode wherein the local test mode input BLK.LTM, the global test mode input BLK.GTM and the scan enable input BLK.SE are low, which don't care signal levels of the select control input BLK.SC, the global scan in BLK.GSI, the global scan out BLK.GSO, the local scan in BLK.LSI and the local scan out BLK.LSO.

Figure 6:
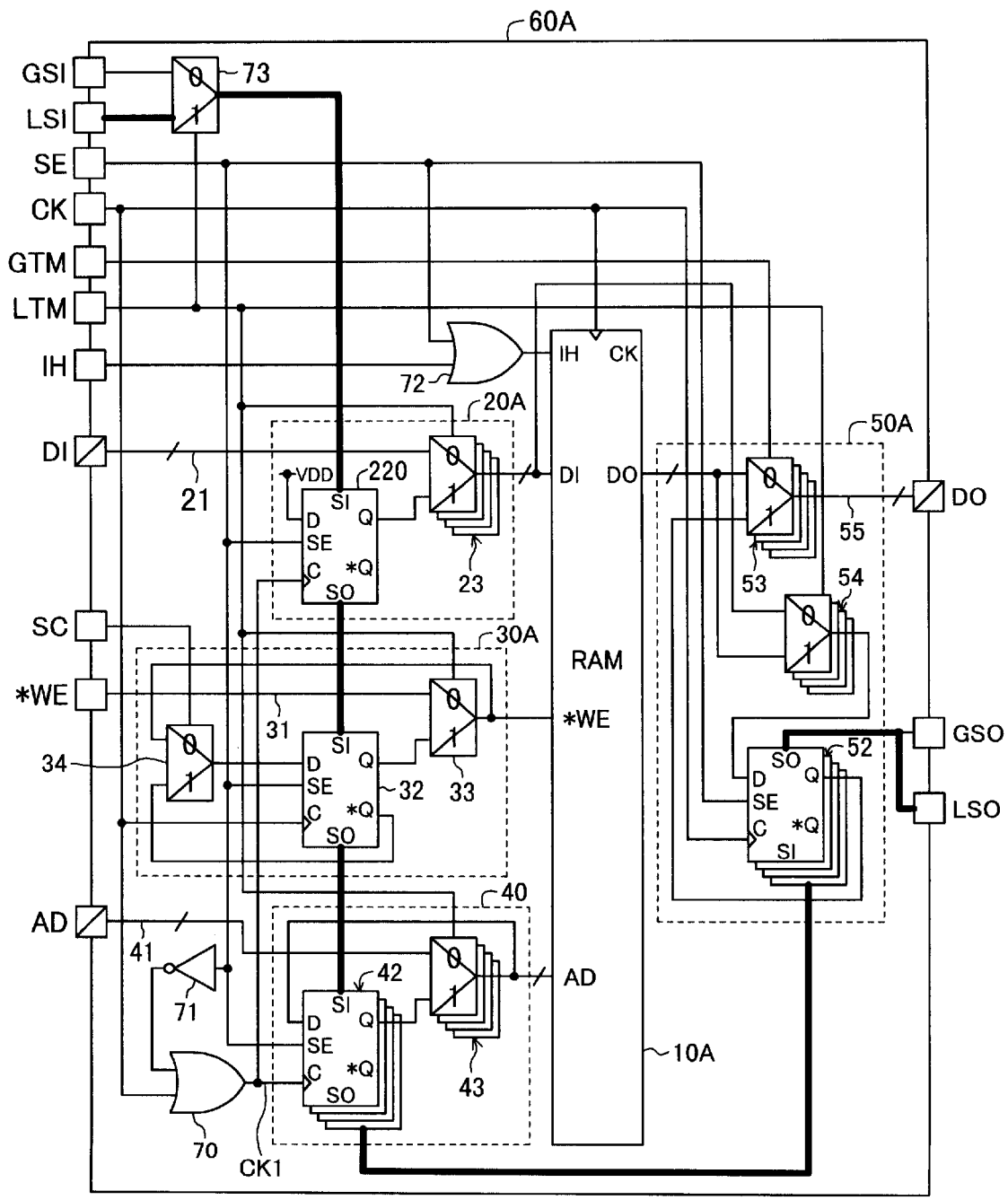
FIG. 6 is an illustrative circuit diagram depicting an effective data path in a shift operation mode, with thick lines, when a functional test is performed on the RAM in the circuit of FIG. 1.

FIG. 6 is an illustrative circuit diagram in a shift operation (state setting) of a functional test on the RAM 10A in which the local test mode input BLK.LTM and the scan enable input BLK.SE are high, which don't care signal levels of the global test mode input BLK.GTM, the global scan in BLK.GSI, the global scan out BLK.GSO and the select control input BLK.SC.

Figure 7:
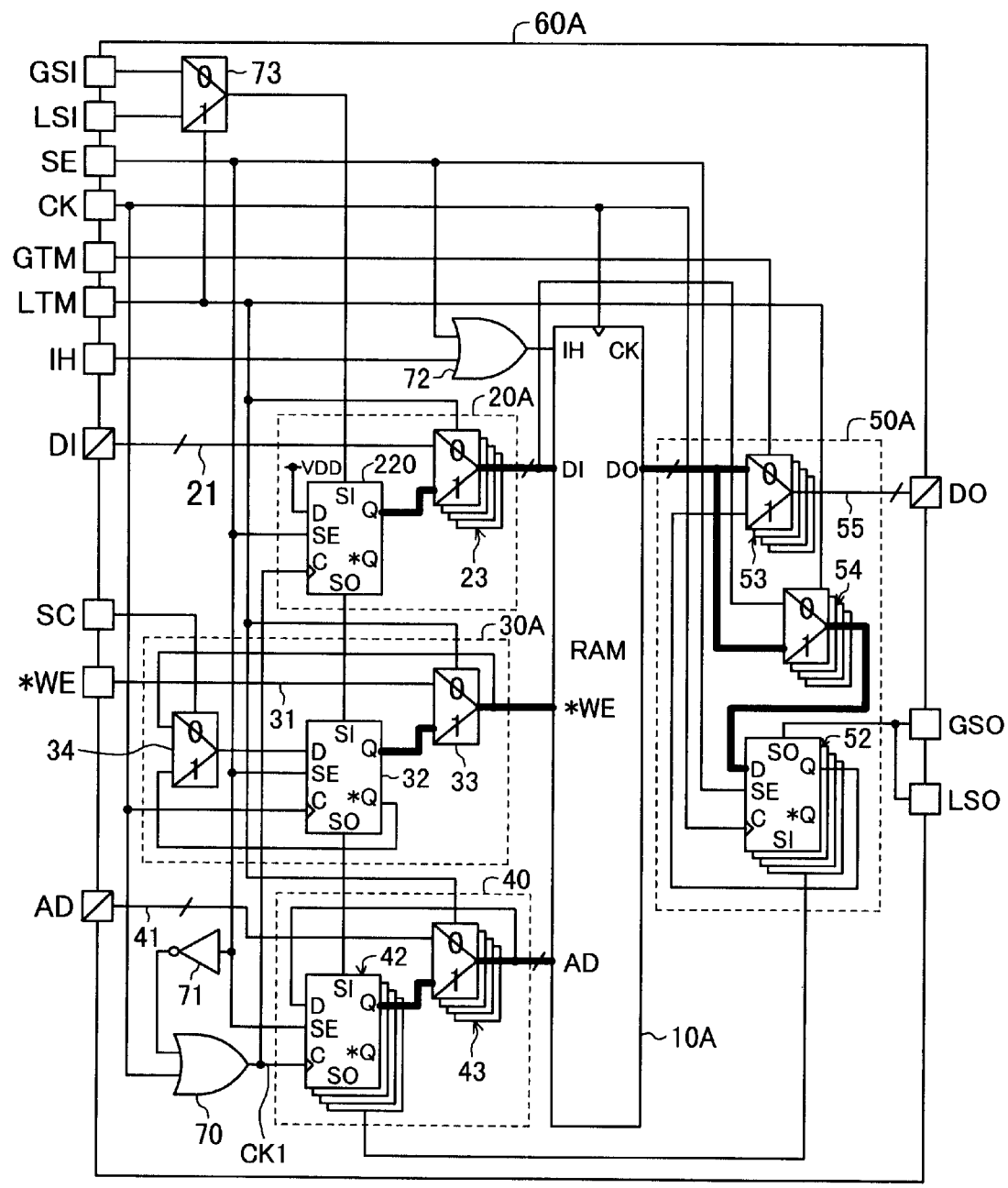
FIG. 7 is an illustrative circuit diagram depicting effective data paths in a write or read operation after the shift operation of FIG. 6 with thick lines.

FIG. 7 shows a case of input to the RAM 10A in a write or read operation and capture into the scan flip-flops 52 from the output of the RAM 10A in a read operation, carried out after the shift operation of FIG. 6, wherein the local test mode input BLK.LTM is high and the scan enable input BLK.SE is low, which don't care signal levels of the global test mode input BLK.GTM, the global scan in BLK.GSI, the global scan out BLK.GSO, the local scan in BLK.LSI and the local scan out BLK.LSO. The select control input BLK.SC transits from low to high as described above in transition from a read to a write operation.

Figure 8:
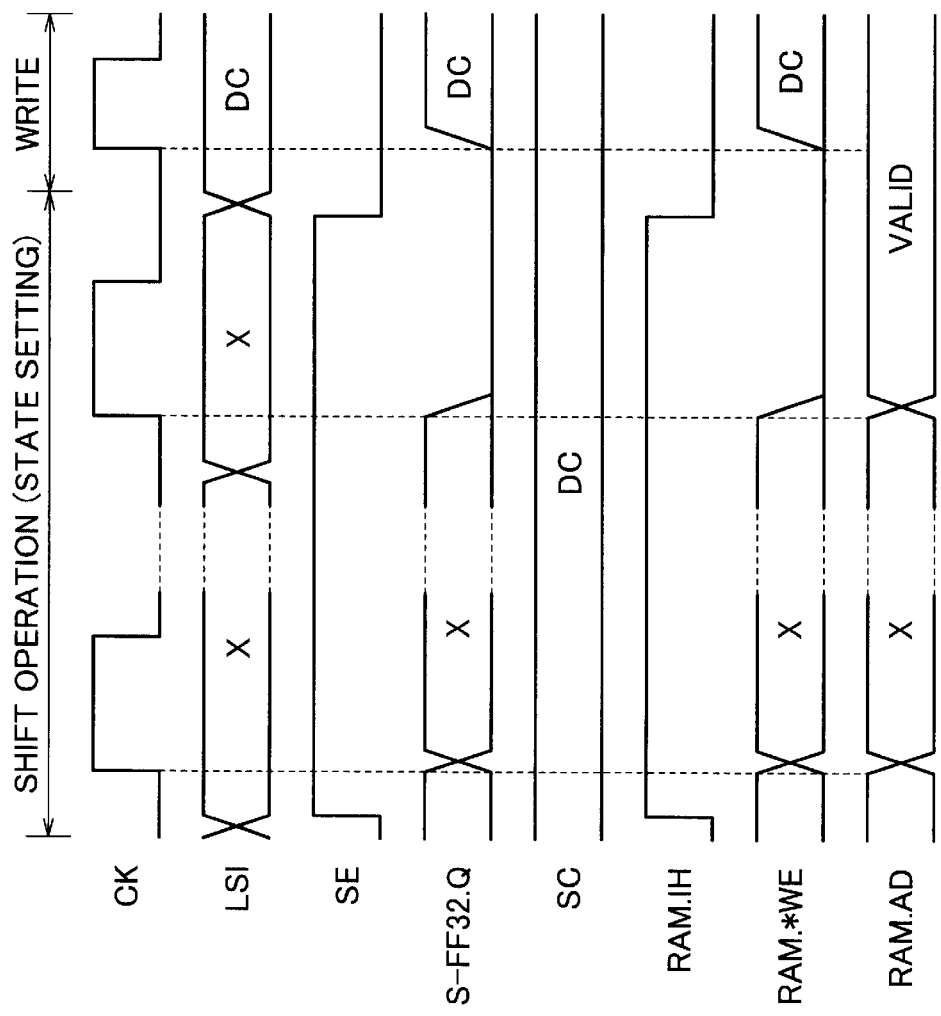
FIG. 8 is a timing diagram illustrating a write test operation for one arbitrary address in a marching pattern test.

FIG. 8 is a timing diagram illustrating a write test operation for one arbitrary address in the above (1) or (4) of the marching pattern test.

At first a shift operation (state setting) on the local scan shift register is performed, and then a write operation on the RAM 10A is performed. A symbol X in FIG. 8 denotes that a corresponding value is dependent on state setting data, a symbol DC denotes "don't care" and a symbol S-FF32.Q denotes the output Q of the scan flip-flop 32.

Since LTM='1', RAM.*WE is equal to S-FF32.Q. On the rise of the final shift clock pulse in the shift mode, *WE becomes '0'. Since the RAM 10A is of a synchronous type, on a rise of the next clock pulse RAM.*WE='0' is captured into the RAM 10A to cause RAM 10A to enter into a write state and an operation is performed that input data RAM.DI which has been valid is written at an address having the value of RAM.AD.

Figure 9:
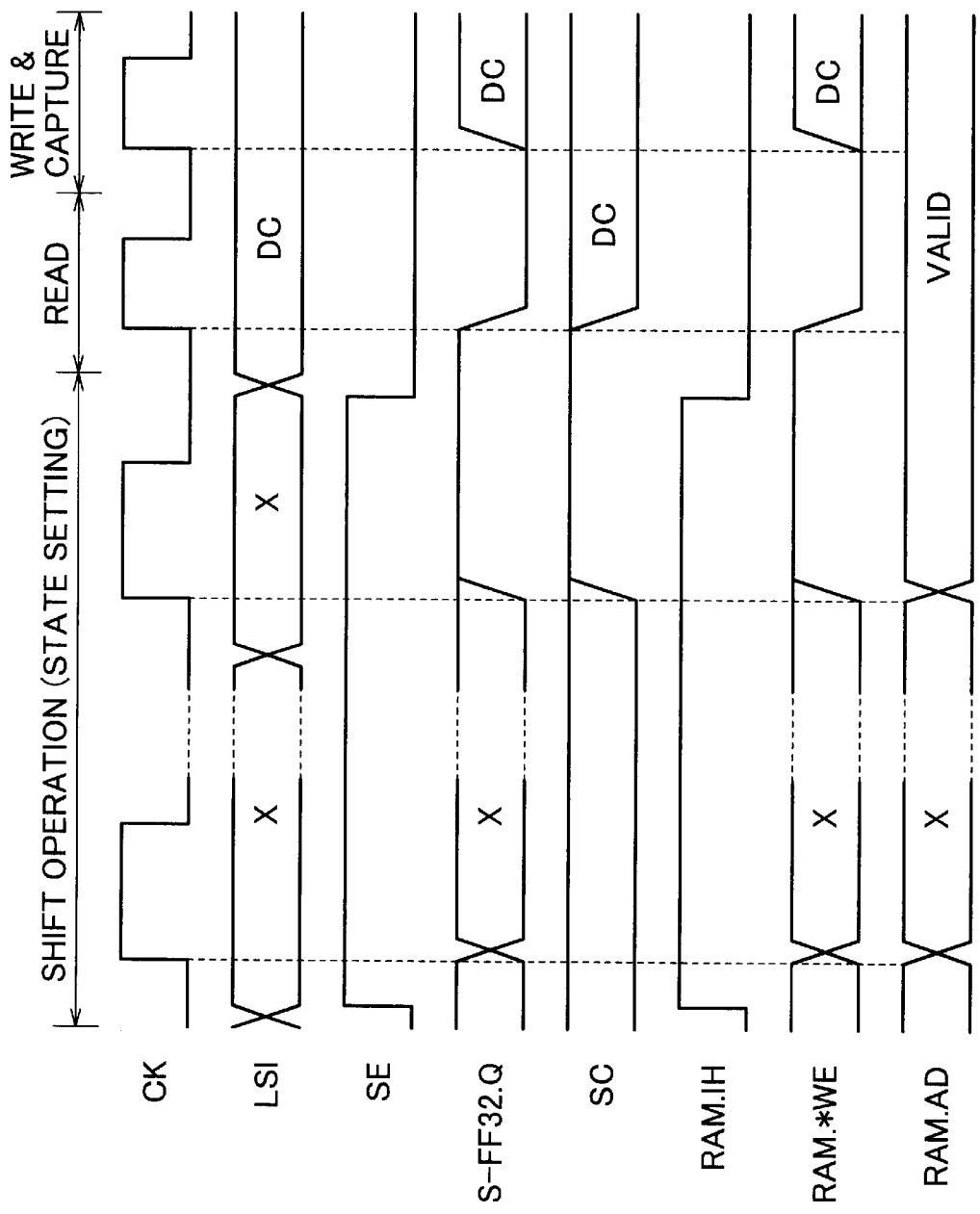
FIG. 9 is a timing diagram illustrating a read and write test operation for one arbitrary address in the marching pattern test.

FIG. 9 is a timing diagram illustrating a read and write test operation for one arbitrary address in the above (2), (3), (5) or (6) of the marching pattern test.

Since LTM='1', RAM.*WE is equal to S-FF32.Q.

On the rise of the final shift clock pulse in the shift mode, S-FF32.Q , RAM.*WE and SC become '1' and the inverted output *Q of the scan flip-flop 32 is provided to the data input D of the scan flip-flop 32 through the selector 34.

On the rise of the next clock pulse, RAM.*WE='1' is captured into the RAM 10A to cause the RAM 10A to enter into a read state and an address RAM.AD which has been valid is captured into the RAM 10A to carry out a read operation. On the other hand, on this rise of the clock pulse, the output Q of the scan flip-flop 32 is inverted to '0' and RAM.*WE also alters to '0'.

On the rise of the still next clock pulse, RAM.*WE='0' is captured into the RAM 10A to cause the RAM 10A to enter into a write state, input data RAM.DI which has been valid is written at an address having the value of RAM.AD and in parallel to this, data DO which has been read out from the RAM 10A is captured into the scan flip-flops 52.

Figure 10:
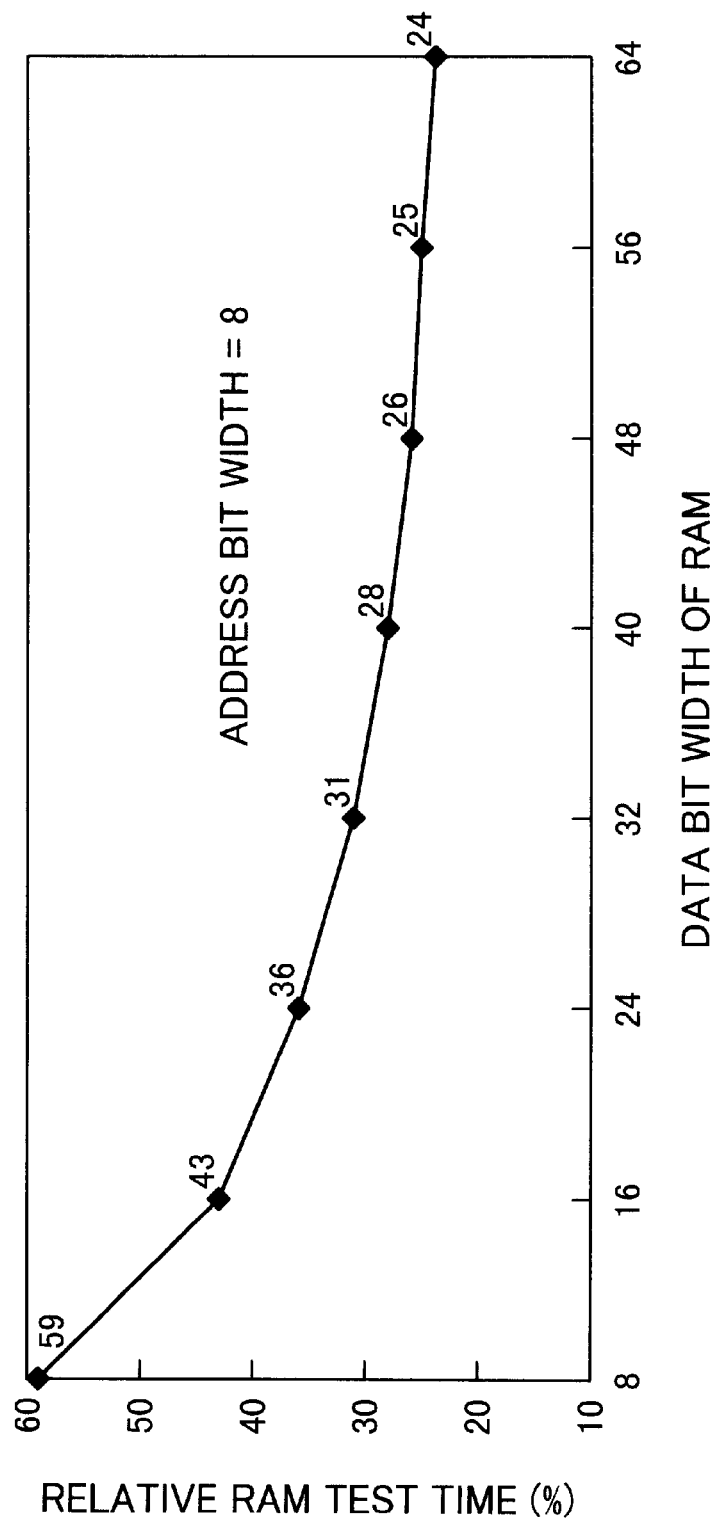
FIG. 10 is a graph whose abscissa represents data bit width and ordinate represents the percentage of RAM test time of the test facilitation circuit of FIG. 1 to that of the circuit of FIG. 19.

FIG. 10 shows a percentage of a RAM test time of the test facilitation circuit of FIG. 1 relative to that of the circuit of FIG. 19 when the address bit width (M−1) is 8. The abscissa represents a data bit width (N−1). As is obvious from this figure, with increase in data bit width, a greater effect of decrease in test time is obtained. For example, when the data bit width is 32, the RAM test time can be shorter than the prior art value by 69%.

Figure 11:
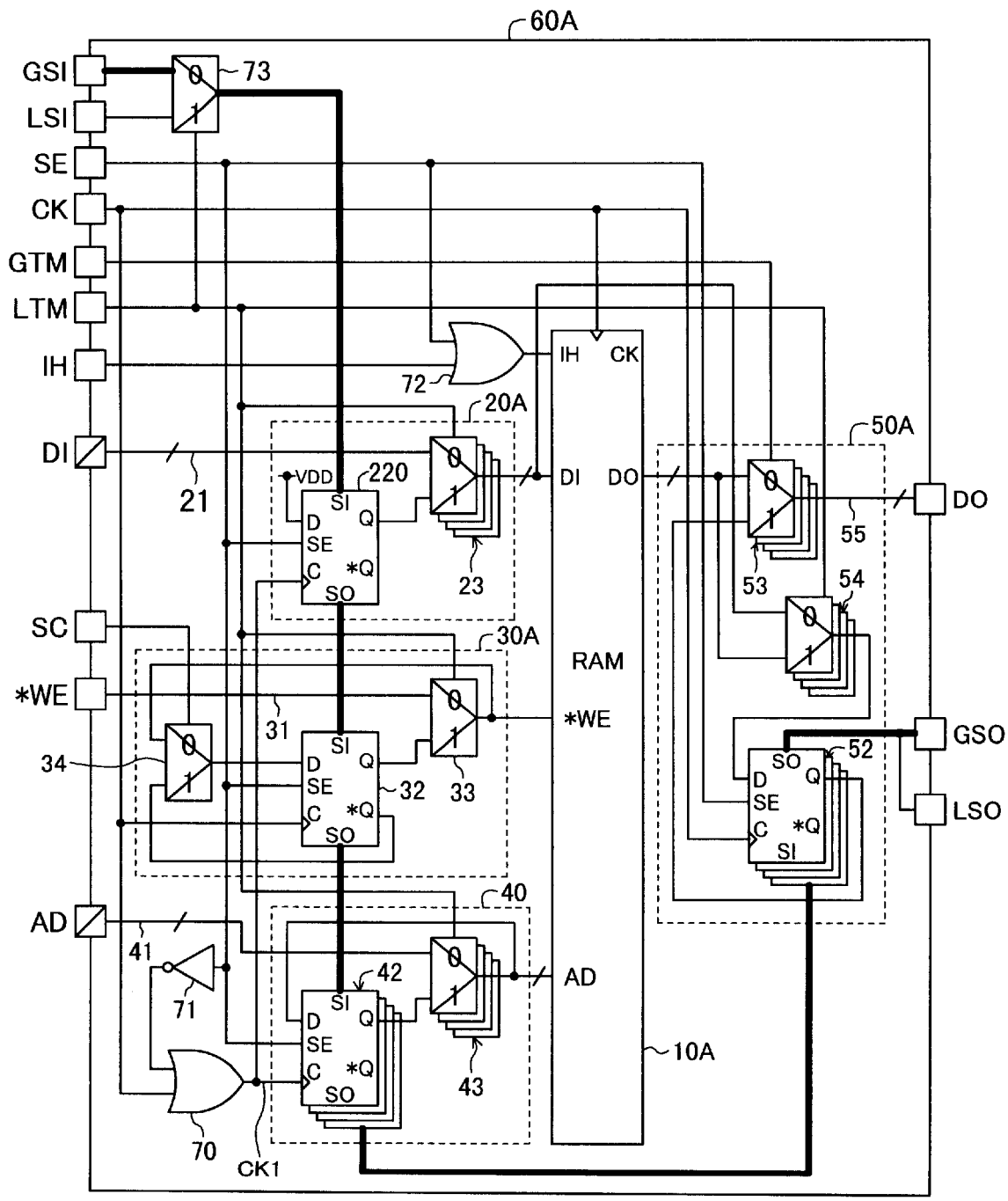
FIG. 11 is an illustrative circuit diagram depicting an effective data path in a shift operation, with thick lines, when a test is performed on a combinational circuit in a chip through the use of a global scan path.

FIG. 11 is an illustrative circuit diagram in a shift operation of a case where a test on an on-chip combinational circuit is performed with the use of global scan path including the circuit block 60A, and shows effective data paths depicted with thick lines, wherein the local test mode input BLK.LTM is low and the global test mode input BLK.GTM and the scan enable input BLK.SE are high, which don't care signal levels of the select control input BLK.SC, the local scan in BLK.LSI and the local scan out BLK.LSO.

Figure 12:
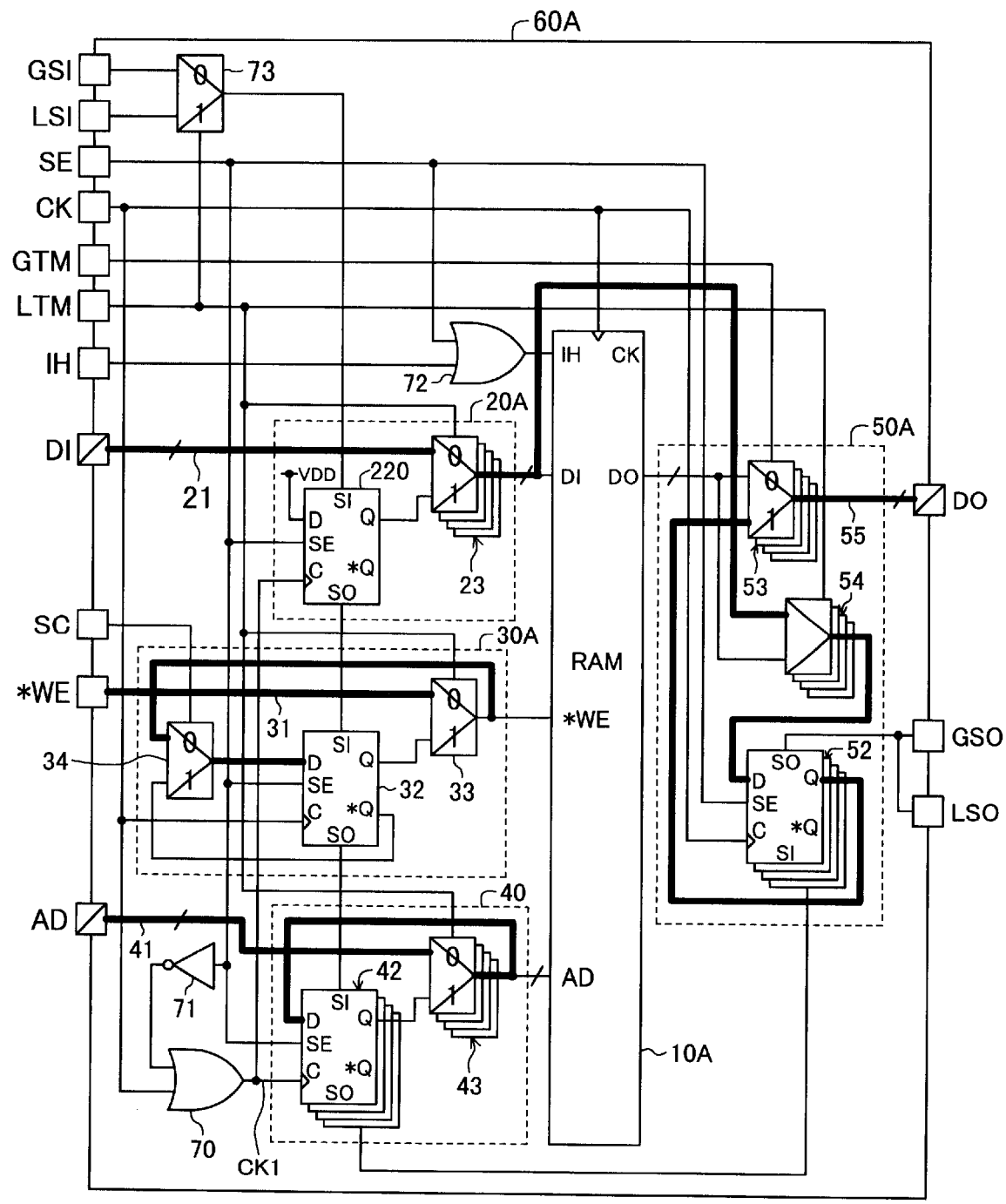
FIG. 12 is an illustrative circuit diagram depicting effective data paths, with thick lines, when the output of the RAM is provided to the combinational circuit after the shift operation of FIG. 11, and thereafter when the output of the combinational circuit is captured into a scan shift register by one clock pulse.

FIG. 12 shows effective data paths depicted with thick lines when the output of the scan flip-lop 52 is provided to the combinational circuit as the output of the RAM 10A after the shift operation of FIG. 11 and thereafter when the output of the combinational circuit to the RAM 10A is captured by the scan flip-flops 32, 42 and 52 in response to one clock pulse. In this case, the local test mode input BLK.LTM, the select control input BLK.SC and the scan enable input BLK.SE are low, and the global test mode input BLK.GTM is high, which don't care signal levels of the global scan in BLK.GSI, the global scan out BLK.GSO, the local scan in BLK.LSI and the local scan out BLK.LSO.

According to the first embodiment, since the contents of the scan flip-flops 220 and 42 are maintained during the operation of the RAM 10A and further the output Q of the scan flip-flop 32 is inverted in transition from a read operation to a write operation; test data has only to be set in the scan register a single time in a read and write operation for the same address, thereby enabling a test time to greatly decrease than the prior art.

Figure 13:
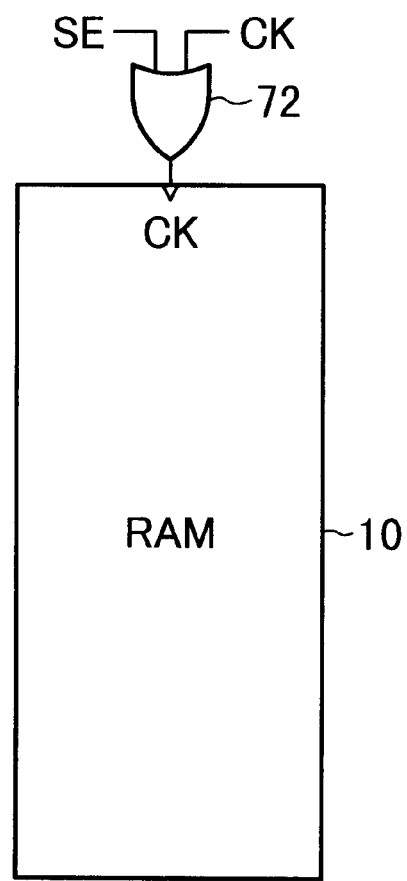
FIG. 13 is a diagram showing part of a RAM functional test facilitation circuit of a modification made to the first embodiment according to the present invention.

FIG. 13 is a diagram showing part of a RAM functional test facilitation circuit of a modification made to the first embodiment.

In a case where the RAM 10 has no inhibit input RAM.IH, signals of the scan enable input BLK.SE and the clock input BLK.CK are provided to the OR gate 72 and the output of the OR gate 70 is provided to the clock input RAM.CK. When the scan enable input SE is high and the scan register is in a shift mode, the clock input RAM.CK maintains high, and therefore the operation of the RAM 10A ceases.

Second Embodiment

Figure 14:
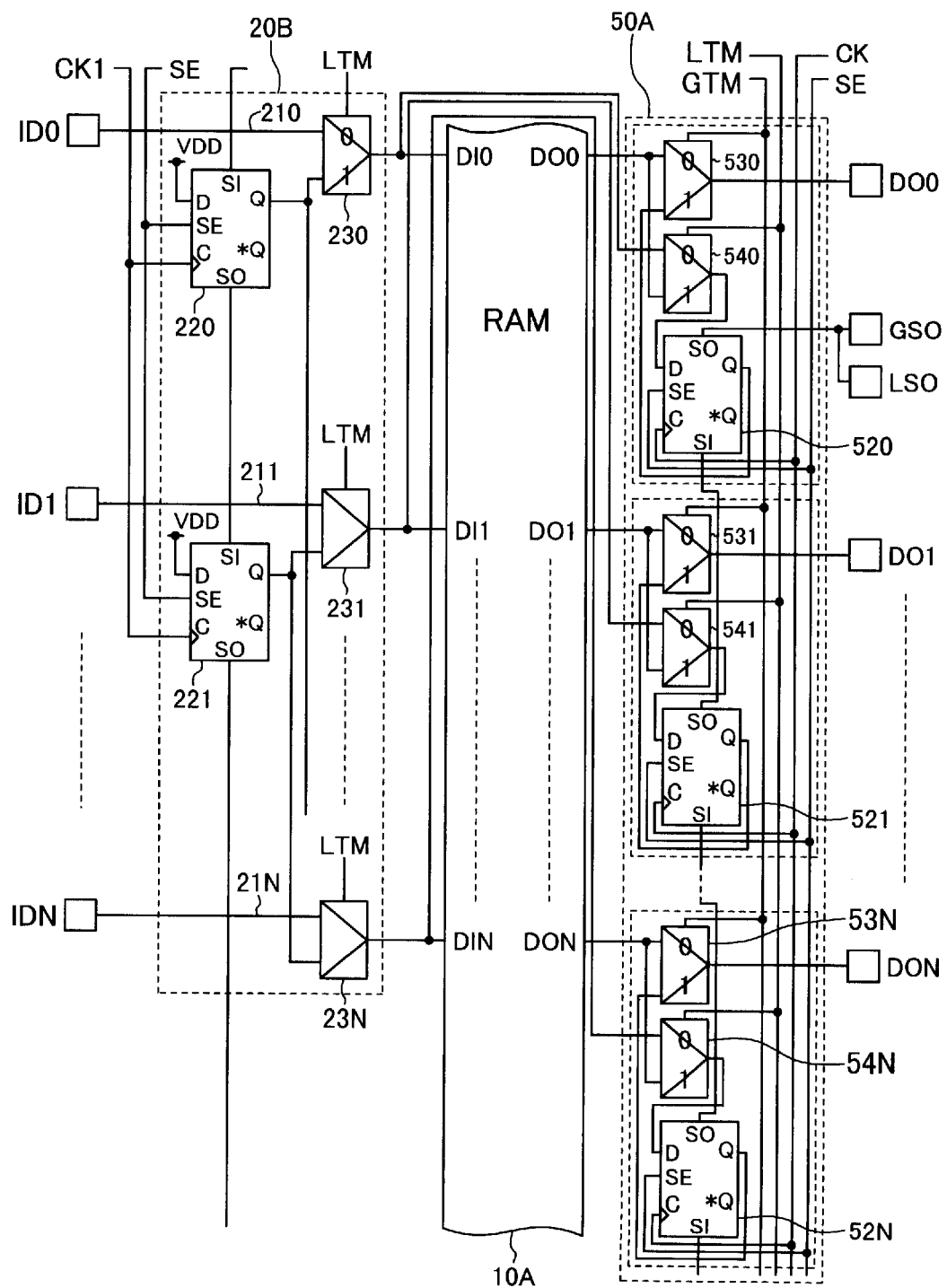
FIG. 14 is a diagram showing part of a RAM functional test facilitation circuit of a second embodiment according to the present invention.

FIG. 14 shows part of a RAM functional test facilitation circuit of a second embodiment according to the present invention.

In this test facilitation circuit, in order to enable not only the marching pattern test but also the check board pattern test, scan flip-flops 220 and 221 are provided in a holding and selecting circuit 20B, the output Q of the scan flip-flop 220 is commonly provided to one inputs of the odd-numbered ones of selectors 230 to 23N, while the output Q of the scan flip-flop 221 is commonly provided to one outputs of the even-numbered ones of the selectors 230 to 23N.

The other points in configuration are the same as those of the above first embodiment.

In the marching pattern test, the same values are held in the scan flip-flops 220 and 221 and the outputs thereof to the selectors 230 to 23N are the same as those in the case of the above first embodiment. In the check board pattern test, mutually different values are held in the scan flip-flops 220 and 221.

Now description will be given of the check board pattern test.

For example, the data input RAM.DI has 8 bits and the operation of writing '01010101' or '10101010' for an address is denoted by W(01) or W(10), respectively, and the operation of reading data from an address where '01010101' or '10101010' has been written is denoted by R(01) or R(10), respectively.

The following processing is carried out in the check board pattern test:

(7) W(01)s are sequentially carried out in ascending order of address; and (8) R(01)s are sequentially carried out in ascending order of address.

Next, the following processing is performed that 0 and 1 are inverted in the above operations (7) and (8):

(9) W(10)s are sequentially carried out in ascending order of address; and

(10) R(10)s are sequentially carried out in ascending order of address.

A timing diagram of the write operation for one address in the above (7) or (9) in the check board pattern test is the same as that of FIG. 8.

Description will be given of a read test operation for one arbitrary address in the above (8) or (10) in the check board pattern test, in the third embodiment below.

Third Embodiment

Figure 15:
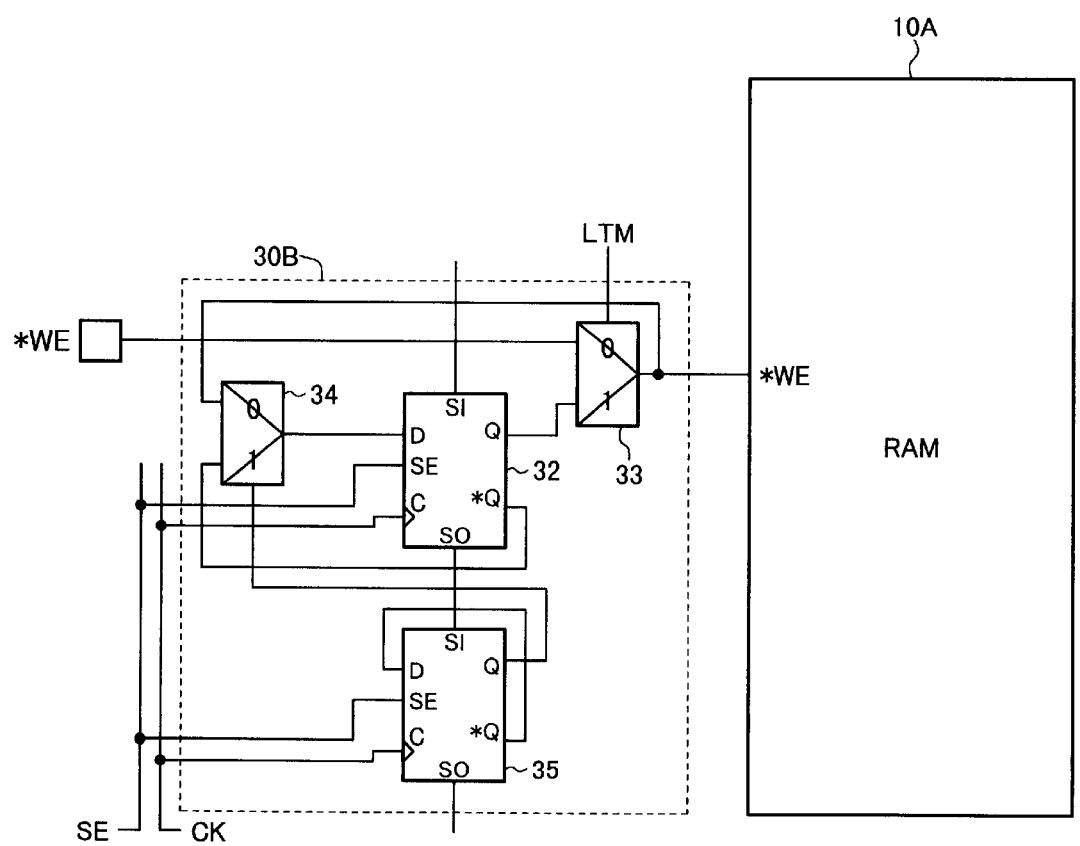
FIG. 15 is a diagram showing part of a RAM functional test facilitation circuit of a third embodiment according to the present invention.

FIG. 15 shows part of a RAM functional test facilitation circuit of a third embodiment according to the present invention.

In a holding and selecting circuit 30B of this test facilitation circuit, a scan flip-flop 35 is additionally provided in order to automatically perform select control on the selector 34. The scan flip-flop 35 is incorporated into the local scan register through connecting the scan out SO and scan in SI thereof so as to enable itself to be initialized in a shift operation according to the test mode without through the use of an external signal. The scan enable input BLK.SE and the clock input BLK.CK are provided to the scan enable input SE and the clock input C of the scan flip-flop 35 in a similar manner to the scan flip-flop 32. The inverting output *Q of the scan flip-flop 35 is connected to the data input D of the scan flip-flop 35 and the non-inverting output Q of the scan flip-flop 35 is connected to the control input of the selector 34.

The other points in configuration are the same as those of the above second embodiment.

Figure 16:
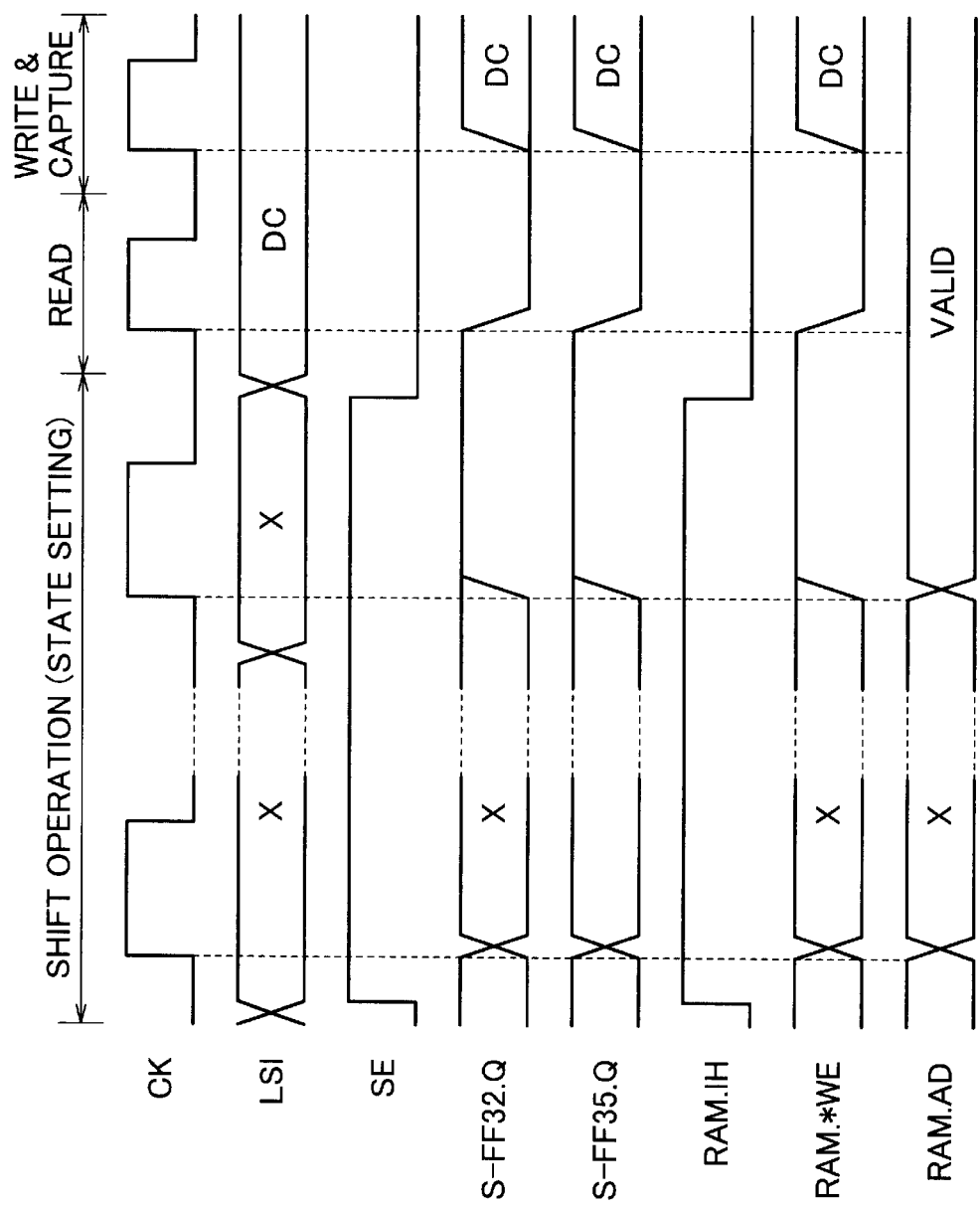
FIG. 16 is a timing diagram illustrating a read and write test operation for one arbitrary address in the marching pattern test through the use of the circuit of FIG. 15.

FIG. 16 is a timing diagram illustrating a read and write operation for one arbitrary address in the marching pattern test.

Since LTM='1', RAM.*WE is equal to S-FF32.Q.

On the rise of the final shift clock pulse in a shift operation, S-FF32.Q, RAM.*WE and S-FF35.Q become high and the inverted output *Q='0' of the scan flip-flop 32 is provided to the data input D of the scan flip-flop 32 through the selector 34.

On the next rise of the clock, RAM.*WE='1' is captured into the RAM 10A to cause the RAM 10A to enter into a read state and an address RAM.AD, which has been valid, is captured into the RAM 10A to perform a read operation. On the other hand, on the rise of this clock, the outputs Q of the scan flip-flops 32 and 35 are inverted to '0' and RAM.*WE also alters to '0'.

On the still next rise of the clock, RAM.*WE='0' is captured into the RAM 10A to cause the RAM 10A to enter into a write state and the input data RAM.DI which has been valid is captured into the RAM 10A at the address having the value of RAM.AD to perform a write operation and in parallel to this, data DO which has been read out from the RAM 10A is captured into the scan flip-flops 52.

Figure 17:
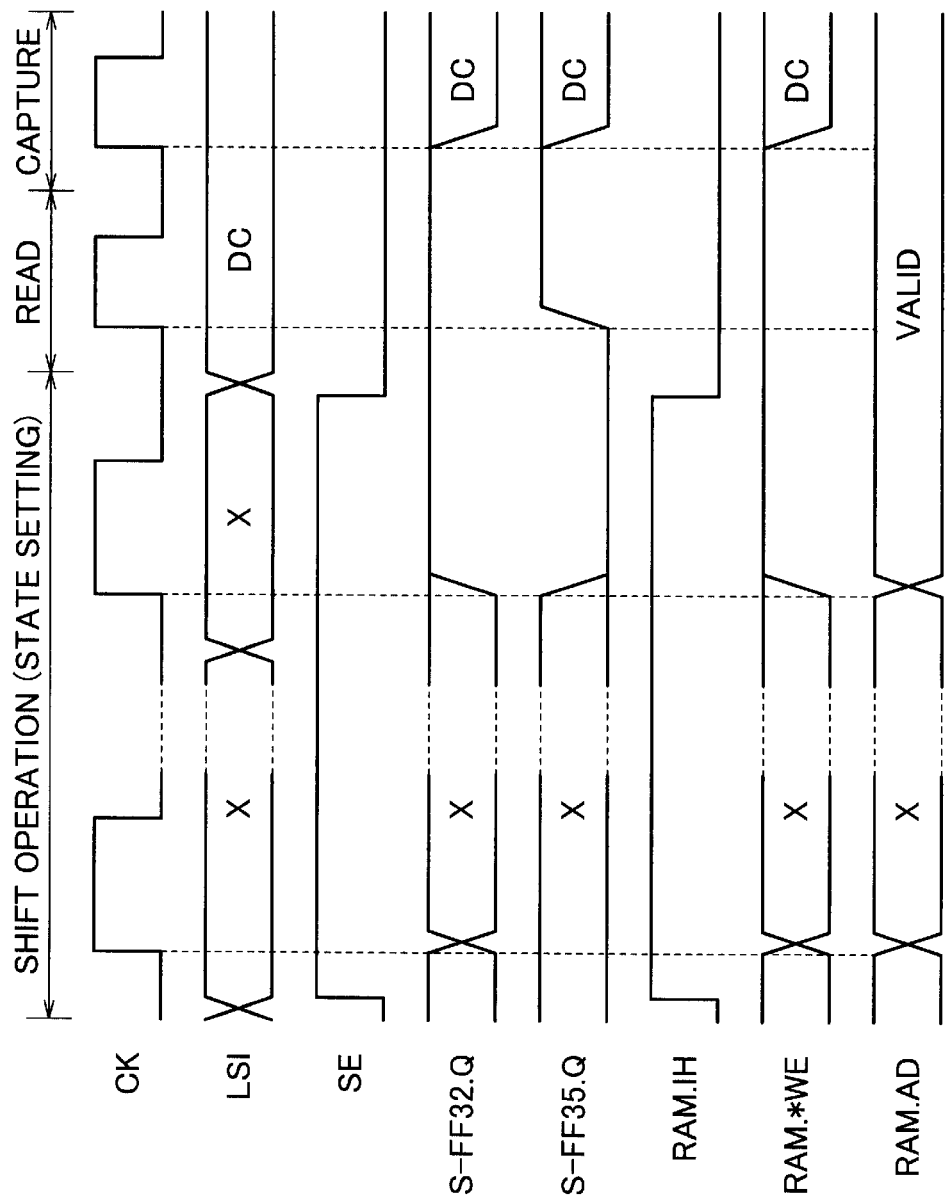
FIG. 17 is a timing diagram illustrating a read test operation for one arbitrary address in a check board pattern test.

FIG. 17 is a timing diagram illustrating a read operation for one arbitrary address in the above (8) or (10) in the check board pattern test.

Since LTM='1', RAM.*WE is equal to S-FF32.Q.

On the rise of the final shift clock pulse in a shift mode, S-FF32.Q, RAM.*WE and S-FF35.Q become to '1', '1' and '0', respectively, and the inverted output *Q='1' of the scan flip-flop 32 is provided to the data input D of the scan flip-flop 32 through the selectors 33 and 34.

On the next rise of the clock, RAM.*WE='1' is captured into the RAM 10A to cause the RAM 10A to enter into a read state and an address RAM.AD which has been valid is captured into the RAM 10A to perform a read operation. On the other hand, on this rise of the clock, although the output Q of the scan flip-flop 32 maintains '1', the output Q of the scan flip-flop 35 is inverted to '1' and the inverted output *Q='0' of the scan flip-flop 32 is provided to the data input D of the scan flip-flop 32 through the selector 34.

On the still next rise of the clock as well, RAM.*WE='1' is captured into the RAM 10A to cause the RAM 10A to maintain the read state. On this rise of the clock, the data DO which has been read from the RAM 10A is captured into the scan flip-flops 52.

Figure 18:
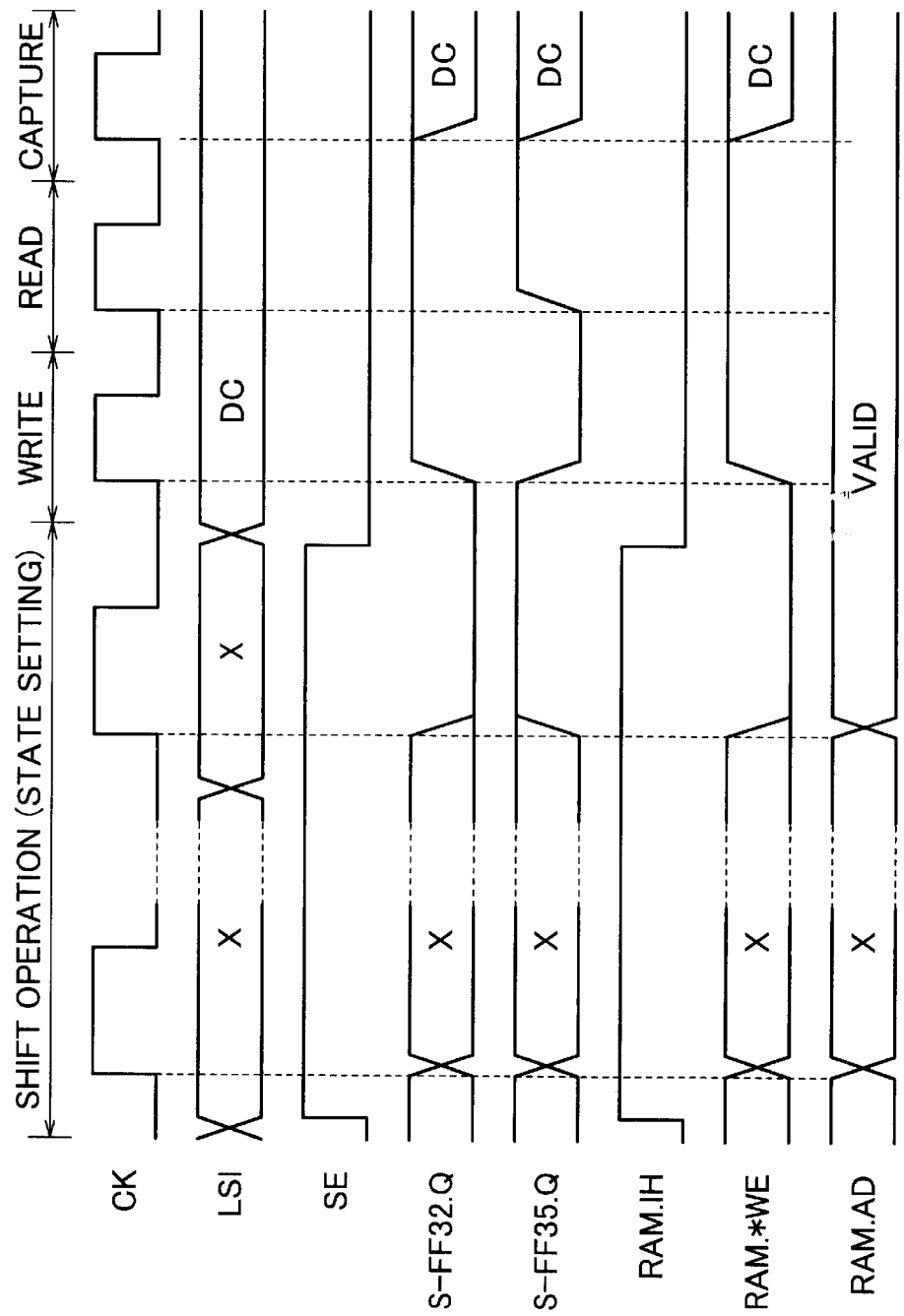
FIG. 18 is a timing diagram illustrating a write and read test operation for one arbitrary address in a pattern test other than the marching pattern test and the check board pattern test.

FIG. 18 is a timing diagram illustrating a write and read operation for one arbitrary address in a pattern test other than the marching pattern test and the check board pattern test described above. Although in a read and write operation, a capture operation on data read out at the second clock from a read operation and a write operation can be performed in parallel to each other as shown in FIG. 9, in a write and read operation, this parallel operation cannot be performed, so three clocks are required.

Since LTM='1', RAM.*WE is equal to S-FF32.Q.

On the rise of the final shift clock pulse in a shift mode, S-FF32.Q and S-FF35.Q become to '0' and '1', respectively, and the inverted output *Q='0' of the scan flip-flop 32 is provided to the data input D of the scan flip-flop 32 through the selector 34.

On the next rise of the clock, RAM.*WE='0' is captured into the RAM 10A to cause the RAM 10A to enter into a write state and the input data RAM.DI which has been valid is written at an address having the value of RAM.AD. On the other hand, on this rise of the clock, the outputs Q of the scan flip-flops 32 and 35 are inverted to '1' and '0', respectively, and RAM.*WE also alters to '1'. Thereby, the non-inverted output Q='1' of the scan flip-flop 32 is provided to the data input D of the scan flip-flop 32 through the selectors 33 and 34.

On the still next rise of the clock, RAM.*WE='1' is captured into the RAM 10A to cause the RAM 10A to enter into a read state and the address RAM.AD which has been valid is captured into the RAM 10A to perform a read operation. On the other hand, on this rise of the clock, although the scan flip-flop 32 maintains '1', the output Q of the flip-flop 35 is inverted to '1'. Thereby, the inverted output *Q=0 of the scan flip-flop 32 is provided to the data input D of the scan flip-flop 32 through the selector 34.

On the still next rise of the clock, RAM.*WE='1' is captured into the RAM 10A to cause RAM 10A to maintain the read state. On this rise of the clock, the data DO which has been read from the RAM 10A is captured into the scan flip-flops 52.

According to the third embodiment, since no necessity arises for providing a signal to the select control input IC.SC from a test apparatus not shown, the number of inputs of a semiconductor chip can be reduced by one. Further, by initializing the scan flip-flop 35 in a shift operation according to the test mode, a sequential signal RAM.*WE can be automatically produced; therefore, easy control on a RAM by the test apparatus is ensured.

Note that since the number of circuit elements of the holding and selecting circuit 30A of FIG. 1 receiving the select control input BLK.SC is less than that of the holding and selecting circuit 30B, it is effective in a case where no extra space on a chip is available.

Although preferred embodiments of the present invention has been described, it is to be understood that the invention is not limited thereto and that various changes and modifications may be made without departing from the spirit and scope of the invention.

What is claimed is:

1. A circuit for facilitating a functional test on a RAM, said RAM having a plurality of data inputs, address inputs and data outputs, comprising:

a plurality of first selectors each having first and second inputs and an output for selectively outputting a signal on said first or second input according to a mode signal, said first input thereof receiving a data signal in a normal mode, said outputs of said plurality of first selectors being connected to respective said data inputs of said RAM;

a first scan flip-flop having a data input, a scan in, a scan enable input, a data output and a scan out, said data output thereof being commonly connected to ones of said second inputs of said plurality of first selectors;

a plurality of second selectors each having first and second inputs and an output for selectively outputting a signal on this first or second input according to said mode signal, said first inputs of said plurality of second selectors being connected to respective said data outputs of said RAM, said second inputs of said plurality of second selectors being connected to respective said outputs of said plurality of first selectors; and a plurality of second scan flip-flops each having a data input, a scan in, a scan enable input, a data output and a scan out, said data input thereof being connected to said respective outputs of said second selectors;

wherein said first scan flip-flop and said plurality of second scan flip-flops are cascaded with respect to said scan ins and scan outs thereof to constitute a scan register driven by a clock when a scan enable signal is active, said scan enable signal being provided to said scan enable inputs of said first scan flip-flop and said plurality of second scan flip-flops.

2. The circuit of claim 1, further comprising:

a plurality of third selectors each having first and second inputs and an output for selectively outputting a signal on this first or second input according to a test mode signal, said first inputs of said plurality of third selectors being connected to respective said data outputs of said RAM, said second inputs of said plurality of third selectors being connected to respective said data outputs of said plurality of second scan flip-flops.

3. The circuit of claim 1, further comprising:

a third scan flip-flop having a data input, a scan in, a scan enable input receiving said scan enable signal, a data output and a scan out, said data output thereof being commonly connected to the remaining ones of said second inputs of said plurality of first selectors;

wherein said third scan flip-flop is connected with respect to said scan in and scan out thereof so as to constitute part of said scan register.

4. The circuit of claim 3, further comprising:

a plurality of fourth selectors each having first and second inputs and an output for selectively outputting a signal on this first or second input according to said test mode signal, said first input thereof receiving an address signal in said normal mode, said outputs of said plurality of fourth selectors being connected to respective said address inputs of said RAM;

a plurality of fifth scan flip-flops each having a data input, a scan in, a scan enable input receiving said scan enable signal, a data output and a scan out, said data inputs of said plurality of fifth scan flip-flops being connected to respective said outputs of said plurality of fourth selectors, said data outputs of said plurality of fifth scan flip-flops being connected to respective said second inputs of said plurality of fourth selectors;

wherein said plurality of fourth scan flip-flops are connected with respect to said scan ins and scan outs thereof so as to constitute part of said scan register.

5. The circuit of claim 1, wherein said RAM operates in synchronism with an internal clock signal, said circuit further comprising: a first logic circuit ceasing said internal clock when said scan enable signal is active.

6. The circuit of claim 5, wherein said RAM further having a clock input and an inhibit input for ceasing said internal clock when said inhibit input is active, wherein said first logic circuit has a first input receiving said scan enable signal, a second input receiving an inhibit signal, and an output connected to said inhibit input to be activated when said scan enable signal or said inhibit signal is active.

7. The circuit of claim 5, further comprising: a second logic circuit ceasing a clock signal clocking said first and fourth scan flip-flops when said scan enable signal is active.

8. The circuit of claim 7, wherein said RAM further has a write enable input, said circuit further comprising:

a fifth selector having first and second inputs and an output for selectively outputting a signal on said first or second input according to said test mode signal, said output thereof being connected to said write enable input, said first input thereof receiving a write enable signal in said normal mode;

a fifth scan flip-flop having a data input, a scan in, a scan enable input receiving said scan enable signal, first and second data outputs complementary to each other, and a scan out, said first data output thereof being connected to said second input of said fifth selector;

a sixth selector having first and second inputs and an output for selectively outputting a signal on said first or second input according to selection control signal, said output thereof being connected to said data input of said fifth scan flip-flop, said first input thereof being connected to said output of said fifth selector, said second input thereof being connected to said second output of said fifth scan flip-flop;

wherein said fifth scan flip-flop is connected with respect to said scan in and scan out thereof so as to constitute part of said scan register.

9. The circuit of claim 8, further comprising: a sixth scan flip-flop having a data input, a scan in, a scan enable input receiving said scan enable signal, first and second data outputs complementary to each other, and a scan out, said second data output thereof being connected to said data input thereof, either said first or second output thereof providing said selection control signal;

wherein said sixth scan flip-flop is connected with respect to said scan in and scan out thereof so as to constitute part of said scan register.

10. An integrated circuit devise comprising:

a circuit for facilitating a functional test on a RAM, said RAM having a plurality of data inputs, address inputs and data outputs, said circuit for facilitating comprising:

a plurality of first selectors each having first and second inputs and an output for selectively outputting a signal on said first or second input according to a mode signal, said first input thereof receiving a data signal in a normal mode, said outputs of said plurality of first selectors being connected to respective said data inputs of said RAM;

a first scan flip-flop having a data input, a scan in, a scan enable input, a data output and a scan out, said data output thereof being commonly connected to ones of said second inputs of said plurality of first selectors;

a plurality of second selectors each having first and second inputs and an output for selectively outputting a signal on this first or second input according to said mode signal, said first inputs of said plurality of second selectors being connected to respective said data outputs of said RAM, said second inputs of said plurality of second selectors being connected to respective said outputs of said plurality of first selectors; and a plurality of second scan flip-flops each having a data input, a scan in, a scan enable input, a data output and a scan out, said data input thereof being connected to said respective outputs of said second selectors;

wherein said first scan flip-flop and said plurality of second scan flip-flops are cascaded with respect to said scan ins and scan outs thereof to constitute a scan register driven by a clock when a scan enable signal is active, said scan enable signal being provided to said scan enable inputs of said first scan flip-flop and said plurality of second scan flip-flops;

said integrated circuit devise further comprising:

another selector having first and second inputs and an output for selectively outputting a signal on said first or second input according to said test mode signal, said output thereof being connected to a scan in of said scan register; and a logic circuit including a combinational circuit and another scan register having a scan out connected to said first input of said another selector;

wherein RAM test serial data is provided to said second input of said another selector without passing through said another scan register.

11. The integrated circuit devise of claim 10, further comprising:

a plurality of third selectors each having first and second inputs and an output for selectively outputting a signal on this first or second input according to a test mode signal, said first inputs of said plurality of third selectors being connected to respective said data outputs of said RAM, said second inputs of said plurality of third selectors being connected to respective said data outputs of said plurality of second scan flip-flops.

12. The integrated circuit devise of claim 10, further comprising:

a third scan flip-flop having a data input, a scan in, a scan enable input receiving said scan enable signal, a data output and a scan out, said data output thereof being commonly connected to the remaining ones of said second inputs of said plurality of first selectors;

wherein said third scan flip-flop is connected with respect to said scan in and scan out thereof so as to constitute part of said scan register.

13. The integrated circuit devise of claim 12, further comprising:

a plurality of fourth selectors each having first and second inputs and an output for selectively outputting a signal on this first or second input according to said test mode signal, said first input thereof receiving an address signal in said normal mode, said outputs of said plurality of fourth selectors being connected to respective said address inputs of said RAM;

a plurality of fifth scan flip-flops each having a data input, a scan in, a scan enable input receiving said scan enable signal, a data output and a scan out, said data inputs of said plurality of fifth scan flip-flops being connected to respective said outputs of said plurality of fourth selectors, said data outputs of said plurality of fifth scan flip-flops being connected to respective said second inputs of said plurality of fourth selectors;

wherein said plurality of fourth scan flip-flops are connected with respect to said scan ins and scan outs thereof so as to constitute part of said scan register.

14. The integrated circuit devise of claim 10, wherein said RAM operates in synchronism with an internal clock signal, said circuit further comprising: a first logic circuit ceasing said internal clock when said scan enable signal is active.

15. The integrated circuit devise of claim 14, wherein said RAM further having a clock input and an inhibit input for ceasing said internal clock when said inhibit input is active, wherein said first logic circuit has a first input receiving said scan enable signal, a second input receiving an inhibit signal, and an output connected to said inhibit input to be activated when said scan enable signal or said inhibit signal is active.

16. The integrated circuit devise of claim 14, further comprising: a second logic circuit ceasing a clock signal clocking said first and fourth scan flip-flops when said scan enable signal is active.

17. The integrated circuit devise of claim 16, wherein said RAM further has a write enable input, said circuit further comprising:

a fifth selector having first and second inputs and an output for selectively outputting a signal on said first or second input according to said test mode signal, said output thereof being connected to said write enable input, said first input thereof receiving a write enable signal in said normal mode;

a fifth scan flip-flop having a data input, a scan in, a scan enable input receiving said scan enable signal, first and second data outputs complementary to each other, and a scan out, said first data output thereof being connected to said second input of said fifth selector;

a sixth selector having first and second inputs and an output for selectively outputting a signal on said first or second input according to selection control signal, said output thereof being connected to said data input of said fifth scan flip-flop, said first input thereof being connected to said output of said fifth selector, said second input thereof being connected to said second output of said fifth scan flip-flop;

wherein said fifth scan flip-flop is connected with respect to said scan in and scan out thereof so as to constitute part of said scan register.

18. The integrated circuit devise of claim 17, further comprising: a sixth scan flip-flop having a data input, a scan in, a scan enable input receiving said scan enable signal, first and second data outputs complementary to each other, and a scan out, said second data output thereof being connected to said data input thereof, either said first or second output thereof providing said selection control signal;

wherein said sixth scan flip-flop is connected with respect to said scan in and scan out thereof so as to constitute part of said scan register.

* * * * *